United States Patent [19]

Feist

[11] Patent Number: 4,933,295
[45] Date of Patent: Jun. 12, 1990

[54] METHOD OF FORMING A BIPOLAR TRANSISTOR HAVING CLOSELY SPACED DEVICE REGIONS

[75] Inventor: Wolfgang M. Feist, Burlington, Mass.

[73] Assignee: Raytheon Company, Lexington, Mass.

[21] Appl. No.: 289,517

[22] Filed: Dec. 27, 1988

Related U.S. Application Data

[63] Continuation of Ser. No. 47,942, May 8, 1987, abandoned.

[51] Int. Cl.$^5$ .......................................... H01L 21/265
[52] U.S. Cl. ........................................ 437/33; 437/31; 437/41; 437/59; 437/200; 437/193; 437/178; 148/DIG. 10; 148/DIG. 11; 357/34; 357/59
[58] Field of Search .................... 437/31, 32, 33, 200, 437/178, 179, 228, 245, 193, 188, 187; 357/34, 59 H, 59 I; 148/DIG. 10, DIG. 11

[56] References Cited

U.S. PATENT DOCUMENTS

| | | | |
|---|---|---|---|
| 3,717,507 | 2/1973 | Abe | 437/31 |
| 3,753,807 | 8/1973 | Hoare et al. | 148/DIG. 124 |
| 3,777,364 | 12/1973 | Schinella et al. | |
| 3,997,367 | 12/1976 | Yau | 437/31 |
| 4,148,054 | 4/1979 | Hart et al. | 437/33 |
| 4,157,269 | 6/1979 | Ning et al. | |
| 4,187,125 | 2/1980 | Feist | |
| 4,188,707 | 2/1980 | Asano | 148/DIG. 124 |
| 4,209,349 | 6/1980 | Ho et al. | |

(List continued on next page.)

FOREIGN PATENT DOCUMENTS

| | | | |
|---|---|---|---|
| 0110211 | 6/1984 | European Pat. Off. | 437/31 |
| 0033484 | 3/1977 | Japan | 437/31 |
| 0059084 | 5/1979 | Japan | 437/31 |
| 0089457 | 5/1984 | Japan | 437/31 |
| 0089458 | 5/1984 | Japan | 437/31 |
| 2188479 | 9/1987 | United Kingdom | 437/31 |

OTHER PUBLICATIONS

Jambotkar, C., "Fabrication of . . . Transistors", IBM TDB, vol. 19, #3, Aug. '76, pp. 915-918.

"Bipolar Transistor . . . ", IBM TDB, vol. 29, #2, Jul. '86, pp. 776-777.
"NPNP Integrated Structure", IBM TDB, vol. 28, #5, Oct. '85, pp. 2196-2198.
"A Re-Examination of Practical Performance Limits of Scaled n-Channel and p-Channel MOS Devices for VSLI"; Solid-State Electronics, vol. 26, No. 10; pp. 969-986, 1983.

Primary Examiner—Brian E. Hearn
Assistant Examiner—Kevin McAndrews
Attorney, Agent, or Firm—Edmund J. Walsh; Richard M. Sharkansky

[57] ABSTRACT

A method of forming a bipolar transistor comprising the steps of forming a base region in a semiconductor structure and disposing an emitter region on a surface of a first portion of the base region, the emitter region having upper and side surfaces. An active base region is formed in the first portion of the base region and an inactive base region is formed in a second portion of the base region adjacent to the first portion and the side surface of the emitter region. A layer of insulating material is formed over a surface of the inactive base region and over the upper and side surfaces of the emitter region. Portions of such layer are selectively removed to expose the upper surface of the emitter region and a portion of the surface of the inactive base region, and to maintain a region of insulating material between the exposed surface portion of the inactive base region and the side surface of the emitter region. Silicide contacts are formed on the exposed surface portion of the inactive base region and the exposed upper surface of the emitter region, with the insulating material region insulating such contacts from each other. With such arrangement, the spacing between the base and emitter contacts may be substantially reduced, such as to the width of the insulating material region, thereby reducing the size (i.e. width), base-to-emitter resistance, base contact resistance and base-to-emitter and base-to-collector capacitance of the bipolar transistor.

26 Claims, 11 Drawing Sheets

U.S. PATENT DOCUMENTS

| | | |
|---|---|---|
| 4,209,350 | 6/1980 | Ho et al. .......................... 357/591 X |
| 4,289,550 | 9/1981 | Feist . |
| 4,292,730 | 10/1981 | Ports . |
| 4,303,933 | 12/1981 | Horng et al. . |
| 4,309,812 | 1/1982 | Horng et al. . |
| 4,316,209 | 2/1982 | Ho et al. . |
| 4,318,751 | 3/1982 | Horng . |
| 4,338,622 | 7/1982 | Feth et al. . |
| 4,368,573 | 1/1983 | deBrefissan ......................... 357/34 |
| 4,378,630 | 4/1983 | Horng et al. . |
| 4,398,962 | 8/1983 | Kanazawa .............................. 437/33 |
| 4,402,761 | 9/1983 | Feist . |
| 4,408,388 | 10/1983 | Kameyama . |
| 4,425,574 | 1/1984 | Silvestri et al. . |
| 4,431,460 | 2/1984 | Barson et al. . |
| 4,446,476 | 5/1984 | Isaac et al. . |
| 4,495,010 | 1/1985 | Kranzer ......................... 357/591 X |
| 4,569,698 | 2/1986 | Feist . |
| 4,636,822 | 1/1987 | Codella et al. . |
| 4,682,409 | 7/1987 | Thomas ..................... 148/DIG. 11 |
| 4,705,599 | 11/1987 | Suda et al. ............................ 437/33 |
| 4,713,355 | 12/1987 | Gardner ................................ 437/31 |
| 4,746,623 | 5/1988 | Lane ...................................... 437/33 |

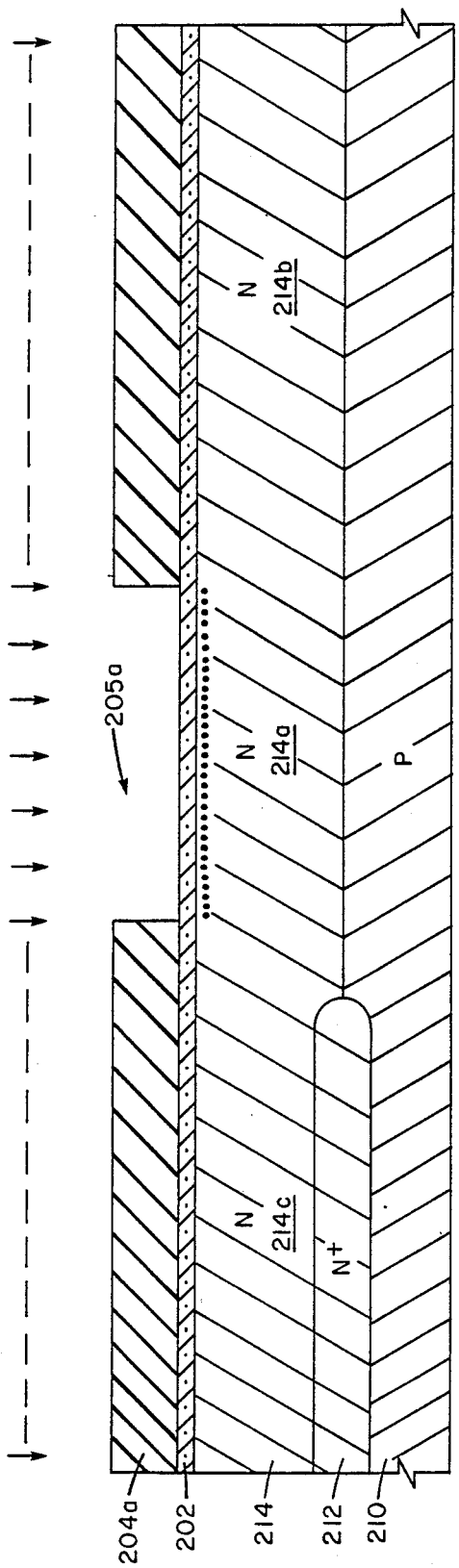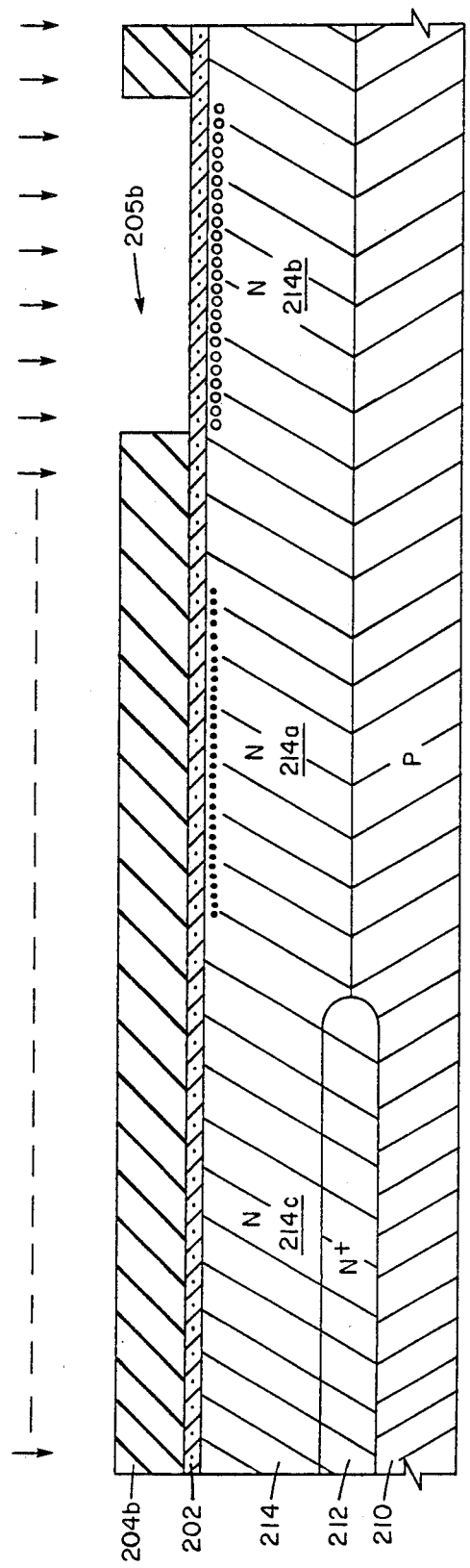

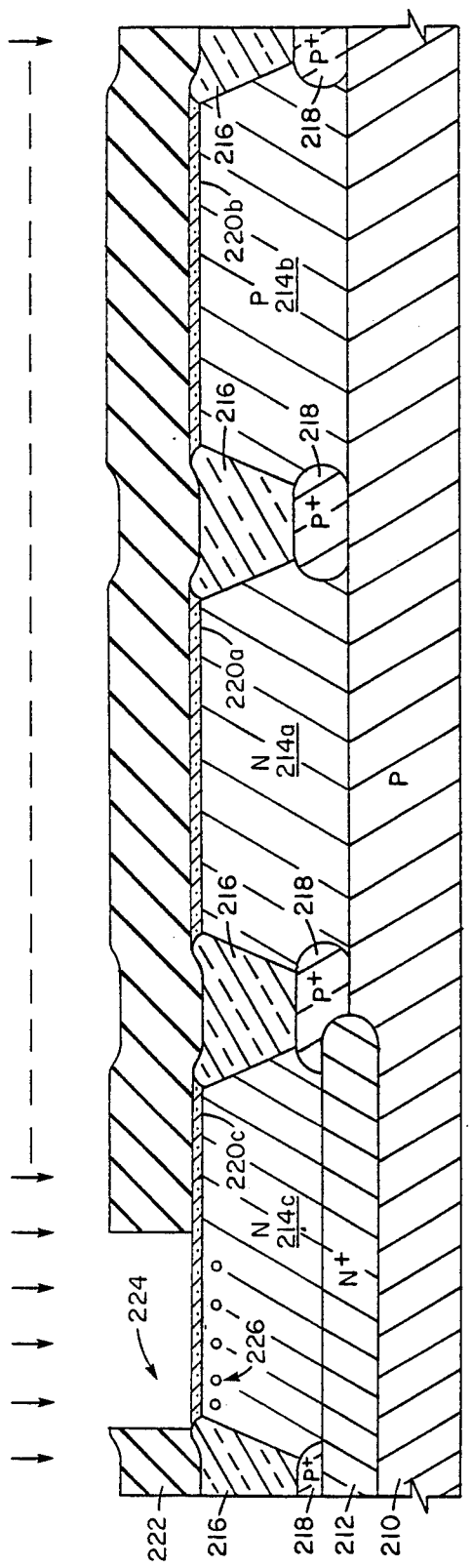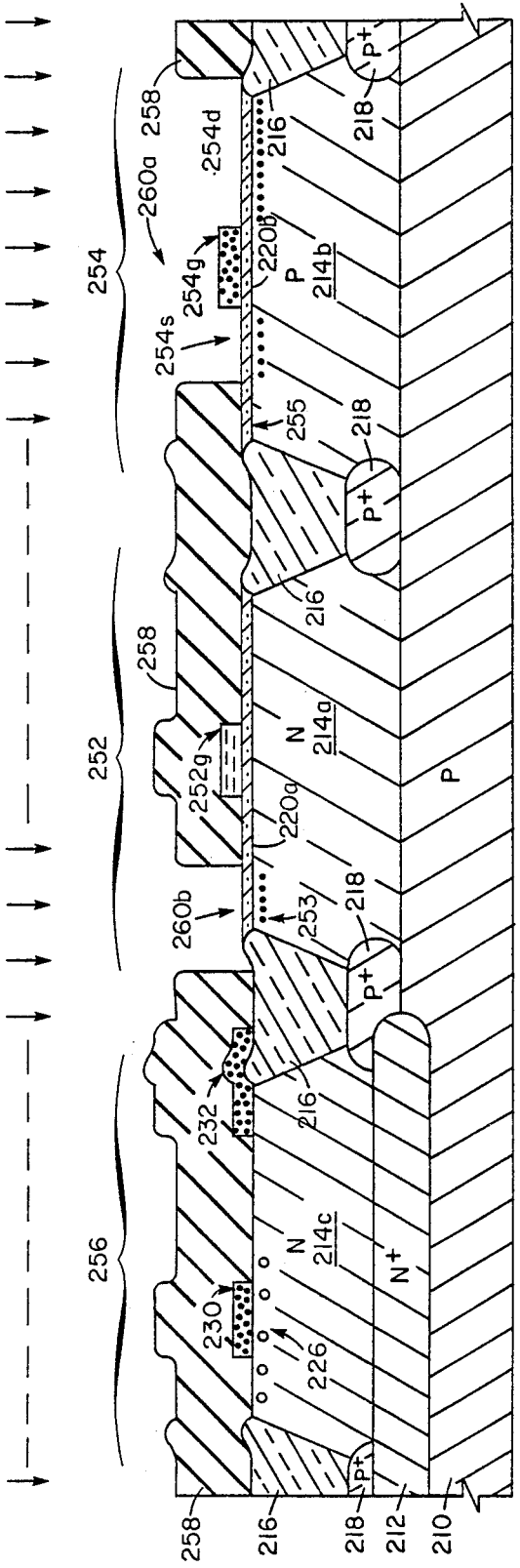

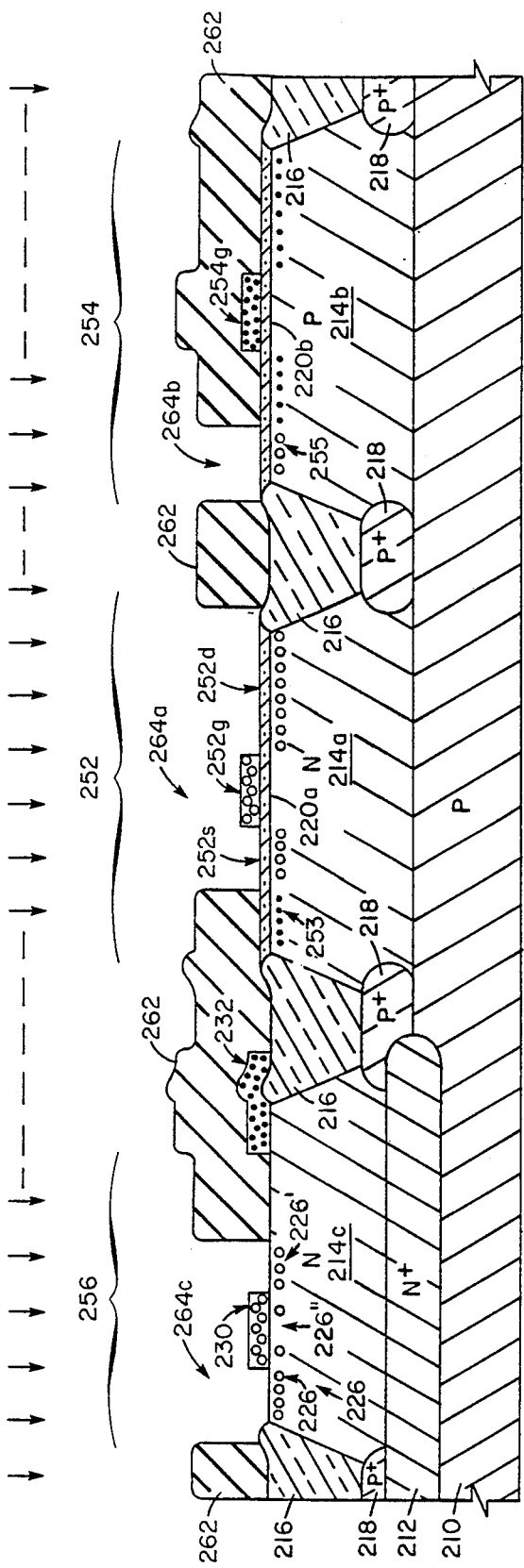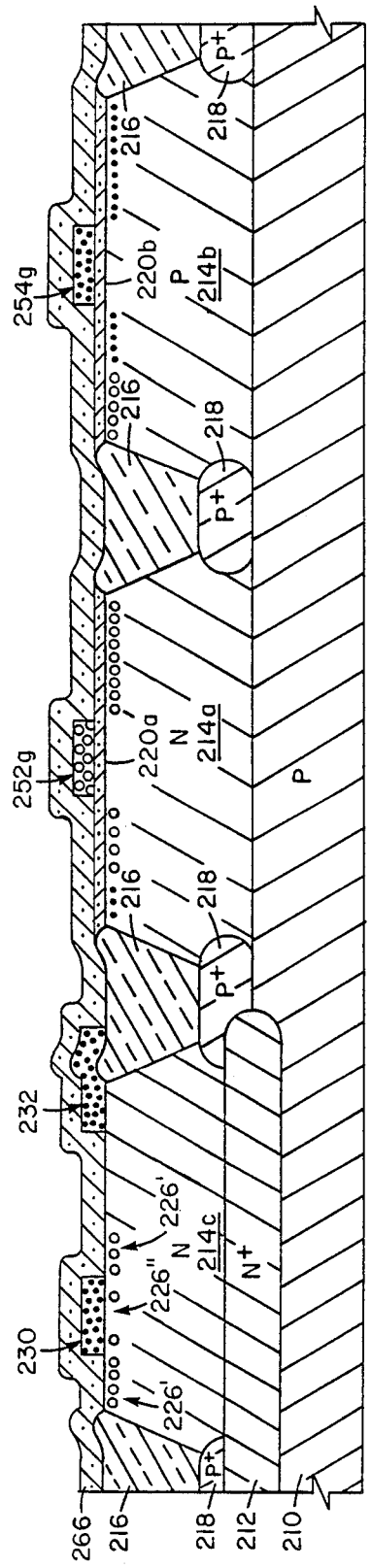
FIG. 25
FIG. 26

METHOD OF FORMING A BIPOLAR TRANSISTOR HAVING CLOSELY SPACED DEVICE REGIONS

This application is a continuation of application Ser. No. 047,942, filed May 8, 1987, now abandoned.

BACKGROUND OF THE INVENTION

The present invention relates generally to semiconductor structures and manufacturing methods and more particularly to bipolar integrated circuit transistor structures and manufacturing methods.

As is known in the art, one method of manufacturing bipolar integrated circuit transistors is to provide an epitaxial layer having a first-type (e.g., n-type) conductivity disposed on a silicon substrate having a second, opposite type (e.g., p-type) conductivity. The transistors are formed in the epitaxial layer and adjacent transistors typically are laterally electrically isolated from each other by insulating isolation regions (such as silicon dioxide regions) formed in the epitaxial layer around the transistors. The epitaxial layer provides a collector region for the transistors. A p-type region typically is formed by diffusion in a portion of an upper region of the n-type epitaxial layer. A portion of the p-type region is heavily doped (i.e., p$^+$-type) thereby forming an "inactive" base region, with the surface of the inactive base region forming the base contact of the transistor. A more lightly doped area of the p-type region forms an "active" base region adjacent the inactive base region, over which is deposited an emitter region comprising a suitably doped region of polysilicon. A similar region of suitably doped polysilicon deposited on the surface of the n-type epitaxial layer and spaced from the p-type diffusion region provides the collector contact for the transistor. To reduce the contact resistance of the base, emitter and collector contacts, silicide contacts are typically formed on the base, emitter and collector contacts by depositing a metal layer (such as platinum or palladium) over the structure, alloying the metal with the p$^+$-type base contact and the upper surfaces of the polysilicon emitter region and collector contact, and removing the unreacted metal. Also, a Schottky-clamped transistor may be formed by additionally alloying the deposited metal with the silicon epitaxial layer at the p-n junction between a portion of the p$^+$-type inactive base region and the n-type epitaxial layer. Then, metal electrodes are conventionally formed on the silicide base, emitter, and collector contacts.

As is also known, the performance characteristics of such a bipolar transistor, measured by the power gain thereof at high operating speeds, may be optimized by decreasing the size of the device by as much as possible, specifically by decreasing the size of the base contact and the spacing between such base contact and the emitter contact (i.e., between the "inactive" base region and the emitter region). As such size and spacing are decreased, the contact resistance, parasitic base resistance and parasitic capacitance of the transistor concomitantly decreases, thereby increasing the operating speed and the available power gain of the device at high frequencies. One technique utilized to decrease the spacing between the inactive base and emitter regions, and hence the parasitic base resistance, forms an oxide layer over the epitaxial layer after the formation of the p-type diffusion region therein. A pair of narrow windows (each having a width on the order of one micrometer or less) are etched through the oxide layer, and the emitter region and collector polysilicon contact are deposited through such windows. The portion of the p-type diffusion region disposed beneath the polysilicon emitter region forms the active base region, and the polysilicon emitter region is used as an ion implantation mask for the formation of the more heavily doped inactive base region adjacent the active base region. Then, a third window is etched in the oxide layer spaced from and adjacent to the polysilicon emitter region and over the inactive base region, and the base contact is formed with such inactive base region by forming a metal silicide contact (for example, using platinum) in the manner discussed above with the inactive base region (at the same time, silicide contacts are made to the emitter region and collector contact and, if desired, a Schottky clamp is formed).

While the above-described manufacturing method has been found satisfactory in some applications, it is often difficult during the manufacturing process to achieve precise registration between the narrow emitter and collector windows and the subsequently applied polysilicon emitter region and collector contact, respectively. As a result, such polysilicon typically overlaps the oxide-layer-windows to ensure the entire openings of such windows are filled with polysilicon. Thus, the base contact window is subsequently formed sufficiently spaced from the emitter region window to avoid the overlapping portions of the polysilicon emitter region. Consequently, the minimum achievable spacing between the emitter and inactive base regions of the transistor is relatively large, on the order of one to two micrometers ($\mu$m). In some high-speed applications, such spacing may be unacceptably large, since the base-to-emitter resistance increases with increasing spacing between the inactive base and emitter regions. Also, the portions of the polysilicon emitter region overlapping the inactive base region increase the emitter-base capacitance of the transistor. Moreover, the base silicide contact is formed only on the surface of the portion of the inactive base region exposed by the base window, resulting in a less than optimal reduction in the lateral base resistance provided by the silicide contact. Further, the inactive base region is itself relatively wide, due to the relatively large spacing between the base contact and emitter region (to allow for polysilicon overlaps), thereby producing a relatively large base-collector capacitance.

SUMMARY OF THE INVENTION

In accordance with the present invention, a method of forming a bipolar transistor in a semiconductor structure is provided comprising the steps of forming a base region in the semiconductor structure and disposing an emitter region on a surface of a first portion of the base region, the emitter region having an upper surface and a side surface. A layer of insulating material is then formed over a surface of a second portion of the base region disposed adjacent to the first portion thereof, and over the upper surface and side surface of the emitter region. Portions of such insulating material layer are selectively removed to expose the upper surface of the emitter region and a portion of the surface of the second portion of the base region, and to maintain a region of the insulating material between the exposed surface portion of the second portion of the base region and the side surface of the emitter region. With such arrangement, the achievable spacing between a contact for the second base region portion and a contact for the emitter region may be substantially reduced, such as to the width of the region of the insulating material, thereby reducing the required size (i.e. width) of the bipolar transistor.

In a preferred embodiment of the present invention, an active base region is formed in the first portion of the base region, over which is disposed the emitter region, with an inactive base region being formed in the second portion of the base region. The layer of insulating material is formed over the surface of the inactive base region and the upper and side surfaces of the emitter region. Portions of the insulating material layer are then selectively removed to expose the upper surface of the emitter region and a portion of the surface of the inactive base region, and to maintain a region of insulating material (i.e. a "sidewall spacer") between the exposed surface of the inactive base region and the side surface of the emitter region. Then, silicide contacts are formed on the exposed surface of the inactive base region and the exposed upper surface of the emitter region, with the sidewall spacer electrically insulating such silicide contacts from each other. Thus, the base and emitter silicide contacts are separated by only the width of a sidewall spacer (such as between 1000 Å and 2500 Å), thereby significantly reducing the base-to-emitter resistance of the transistor. Further, since the emitter region and inactive base region may be formed so closely together, the size (i.e. width) of the inactive base region itself may be reduced. Concomitantly, the base contact (i.e. lateral) resistance and the "up-down" resistance of the inactive base region are reduced due to the decreased size of thereof. Moreover, the base silicide contact may be formed over all of the surface of the inactive base region except for that covered by the sidewall spacer, thereby further lowering the base contact resistance. The smaller inactive base region also reduces the base-collector capacitance of the transistor. Such improvements in the parameters of the bipolar transistor provides increased high frequency power gain and extends the operating frequency of such bipolar transistor.

In accordance with an additional feature of the present invention, a process is provided for fabricating a bipolar transistor having multiple, interdigitated inactive base and emitter regions. A plurality of spaced emitter regions are disposed on a base region, with portions of the base region under the emitter regions forming active base regions and portions of the base region disposed between the emitter regions forming the inactive base regions. A layer of insulating material is deposited over the inactive base regions and a pair of side surfaces and an upper surface of each emitter region. Portions of the insulating material layer are selectively removed to expose the upper surfaces of the emitter regions and portions of the surfaces of the plurality of inactive base regions, and to maintain a pair of insulating material regions abutting the pair of side surfaces of each emitter region. Silicide contacts then are formed on the aforementioned exposed surfaces, with adjacent ones of such silicide contacts being electrically insulated from each other by a region of insulating material.

In accordance with yet another embodiment of the present invention, a method is provided for forming a bipolar transistor and a pair of complementary field effect transistors in a semiconductor structure having a first-type conductivity and a first dopant concentration. A first well of the first-type conductivity and a second dopant concentration is formed in a first region of the semiconductor structure, and a second well having a second-type conductivity, opposite the first-type conductivity, is formed in a second region of the semiconductor structure. A base region having the second-type conductivity is formed for the bipolar transistor in a third region of the semiconductor structure. An emitter region is then disposed on a surface of a first portion of the base region, with a first gate region being disposed over a first portion of the first well and a second gate region being disposed over a first portion of the second well, each one of the emitter region and the first and second gate regions comprising an upper surface and first and second side surfaces. Particles having the first-type conductivity are implanted into: the second gate region; a second portion of the second well adjacent the first portion thereof and the first side surface of the second gate region to form a second source region therein; and a third portion of the second well adjacent the first portion thereof and the second side surface of the second gate region to form a second drain region therein. Then, particles having the second-type conductivity are implanted into: a second portion of the base region adjacent the first portion thereof and the first side surface of the emitter region to form an inactive base region in said second portion of the base region and an active base region in said first portion of the base region; the first gate region; a second portion of the first well adjacent the first portion thereof and the first side surface of the first gate region to form a first source region therein; and a third portion of the first well adjacent the first portion thereof and the second side surface of the first gate region to form a first drain region therein. A layer of insulating material then is formed over the structure and portions thereof are selectively removed to expose portions of the surfaces of the inactive base region, the first source and drain regions, the second source and drain regions and the upper surfaces of the emitter region and first and second gate regions. Such selective removal step maintains: a first region of the insulating material between the exposed surface of the inactive base region and the first side surface of the emitter region; a second region of the insulating material disposed between the exposed surface portion of the first source region and the first side surface of the first gate region; a third region of the insulating material disposed between the exposed portion of the surface of the first drain region and the second side surface of the first gate region; a fourth region of the insulating material disposed between the exposed portion of the surface of the second source region and the first side surface of the second gate region; and a fifth region of the insulating material disposed between the exposed portion of the surface of the second drain region and the second side surface of the second gate region. Then, contacts comprising metal (for example, silicide contacts) are formed on the exposed portions of the surfaces of the inactive base region, the first source and drain regions, the second source and drain regions, and the exposed upper surfaces of the emitter region and first and second gate regions. With such arrangement, bipolar transistors of reduced size may be formed together with complementary MOS transistors on the same substrate to provide a so-called "Bi-CMOS" structure with a minimum of added masking steps.

In accordance with yet another embodiment of the present invention, a method of forming a plurality of doped regions in a semiconductor structure is provided comprising the steps of implanting particles having a first-type conductivity in a first region of the semiconductor structure and implanting particles having a second-type conductivity, opposite to the first-type conductivity, in a second region of the semiconductor structure. A layer comprising silicon nitride is deposited over the first and second regions of the semiconductor structure and the semiconductor structure is heated at a predetermined temperature for a predetermined time selected to drive the first-type conductivity particles to a first predetermined depth in the first region and the second-type conductivity particles to a second predetermined depth in the second region. With such process, the silicon nitride layer is found to substantially prevent the implanted particles from evaporating during the drive cycle (which would decrease dopant concentration) and depositing in other regions of the structure (i.e. "autodoping"), which would contaminate the doping of such other regions. Thus, the first-type conductivity particles can be driven into the first region in the same drive cycle as that used to drive the second-type conductivity particles into the second region, thereby reducing fabrication time.

BRIEF DESCRIPTION OF THE DRAWINGS

The foregoing features of the present invention and the advantages thereof may be fully understood from the following detailed description read in conjunction with the accompanying drawings wherein:

FIGS. 19–28 are cross-sectional elevation views of a bipolar transistor and CMOS field-effect-transistors fabricated together according to a third embodiment of the present invention at various steps in the manufacture thereof.

DESCRIPTION OF THE PREFERRED EMBODIMENTS

Figure 1:
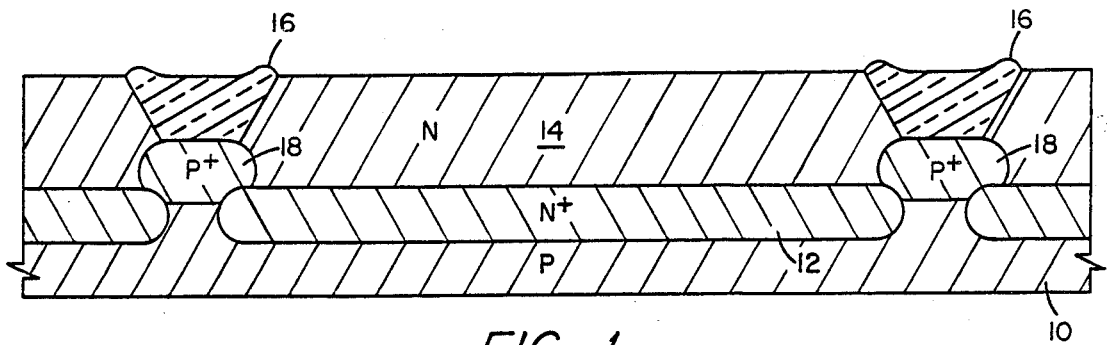
FIGS. 1–8 and 10 are cross-sectional elevation views of a bipolar transistor fabricated according to a first embodiment of the present invention at various steps in the manufacture thereof.

Referring now to FIGS. 1–10, shown are various steps of a process of forming a bipolar transistor device according to a first embodiment of the present invention. Specifically, in FIG. 1, a substrate 10, here comprising p-type conductivity silicon having a surface in the <100> or <111> crystallographic plane and a dopant concentration on the order of $10^{15}$ atoms/cm$^3$, is shown having an n+-type conductivity subcollector region 12 formed therein using any conventional process, here by ion implanting arsenic through a window or windows in a silicon dioxide mask (not shown) followed by an anneal and diffusion step. Alternately, such subcollector region 12 may be formed entirely by diffusion. Here, subcollector 12 is formed to a thickness of approximately 1.5 micrometers ($\mu$m) and with a doping concentration on the order of $10^{20}$ atoms per cm$^3$. After stripping the aforementioned silicon dioxide mask by conventional techniques, an epitaxial layer 14 of n-type conductivity silicon is grown. Here such epitaxial layer 14 is grown to a thickness of between 1.5 and 2.0 $\mu$m and has a dopant concentration of between approximately $5\times10^{15}$/cm$^3$ and $2\times10^{16}$/cm$^3$. Also disposed in substrate 10 are silicon dioxide (SiO$_2$) field oxide regions 16, each having a thickness of approximately 1 $\mu$m, with p+-type conductivity silicon channel stops 18 disposed beneath field oxide regions 16 to form reverse bias junctions between such channel stops 18 and subcollector region 12 and epitaxial layer 14, as shown in FIG. 1. Thus, reverse bias p-n junction isolation is provided between adjacent devices to be formed in epitaxial layer 14 in a manner to be described. Here, field oxide regions 16 and channel sops 18 are formed in the manner described in U.S. Pat. No. 4,569,698, issued to Wolfgang Feist on Feb. 11, 1986, and assigned to the present assignee.

Figure 2:
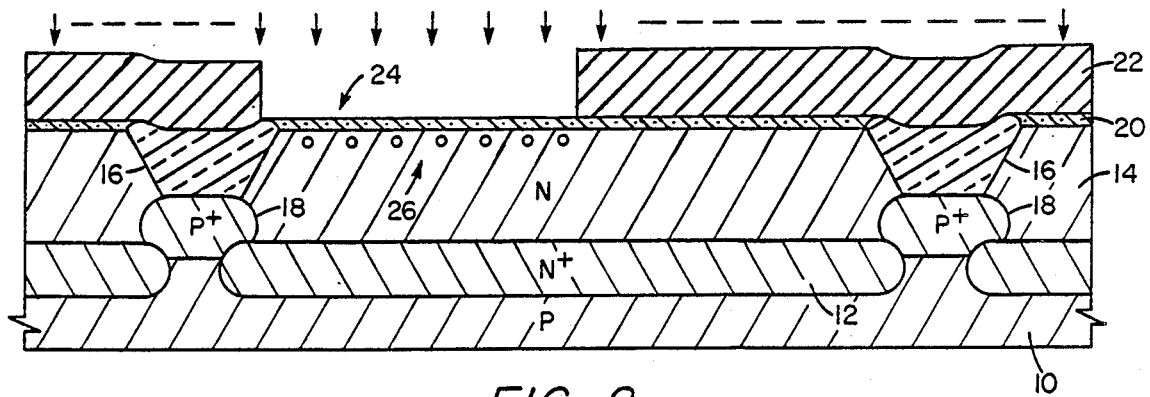

Referring now to FIG. 2, a thin layer 20 of silicon dioxide, here between approximately 150 angstroms (Å) and 250 Å and preferably approximately 200 Å thick, is conventionally grown over the surface of epitaxial layer 14 and a layer 22 of photoresist material is deposited over silicon dioxide layer 20 and field oxide regions 16 as shown. Such photoresist layer 22 is patterned to form window 24 therein, here having a width of between 1.75 $\mu$m and 3.0 $\mu$m. Then, a suitable p-type conductivity dopant, here boron, is ion implanted in a conventional manner to form a p-type base region 26 in which "active" and "inactive" base regions will subsequently be formed in a manner to be described, such base region 26 here being between 1.75 $\mu$m and 3.0 $\mu$m wide. Here, such boron ion implantation is performed at a dosage of $1\times10^{13}$ per cm$^3$ at 30 Kev. At this point of the process, base region 26 is relatively lightly doped, here having a dopant concentration on the order of $1\times10^{18}$ per cm$^3$. The layer 22 of silicon dioxide prevents ion channeling of the implanted boron to allow a shallow p-type region 26, here with a dopant concentration peak at a depth of approximately 1000 Å, to be formed in epitaxial layer 14.

Figure 3:
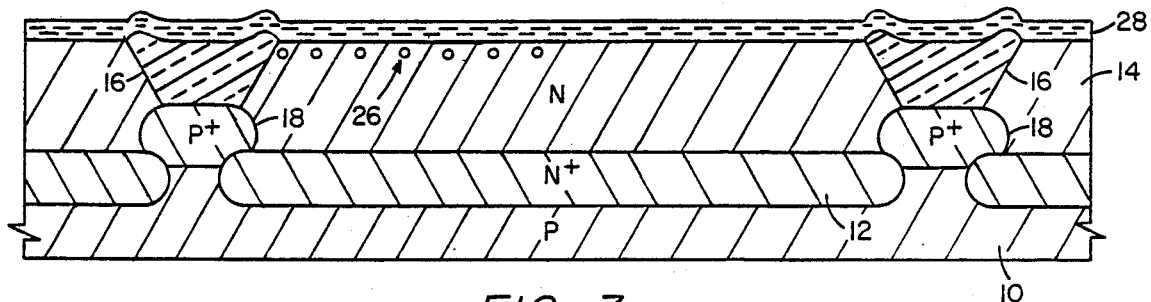
Figure 4:
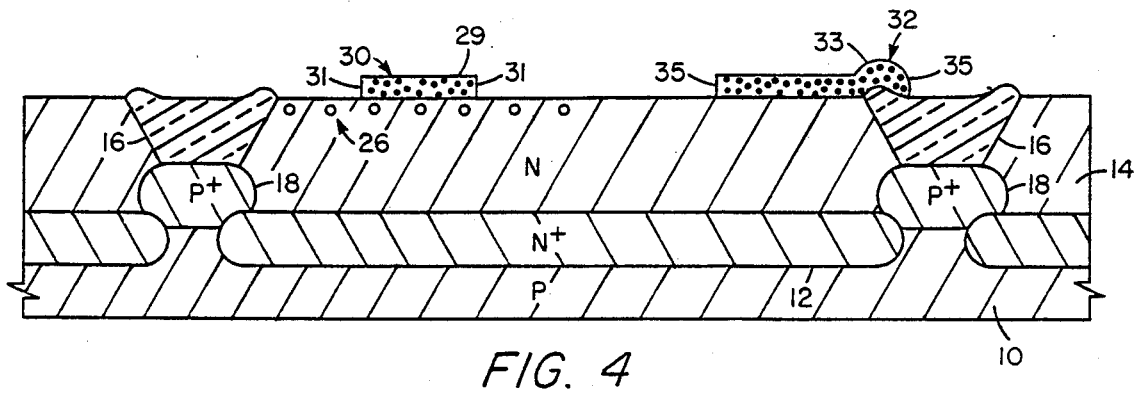

Referring now to FIG. 3, photoresist layer 22 and oxide layer 20 are removed from the structure in a conventional manner, and a layer 28 of polysilicon is deposited over the surface of the structure in a conventional manner, here to a thickness of about 2500 Å. Referring also to FIG. 4, polysilicon layer 28 is here doped with implanted arsenic at a dosage of $5\times10^{15}$ to $1\times10^{16}$ per cm$^2$ at 160 Kev and a photoresist layer (not shown) is then deposited and patterned to cover only selected regions 30, 32 of polysilicon layer 28 which will become the emitter region and collector contact, respectively, of the bipolar transistor. Such emitter region 30 and collector contact 32 are formed from such polysilicon layer 28 by removing the regions of polysilicon layer 28 exposed by the photoresist in a conventional manner, such as by reactive ion etching or plasma etching. Here, polysilicon emitter region 30 and collector contact 32 each have approximately the same width, between approximately 0.5 $\mu$m and 1.0 $\mu$m.

It is noted that since base region 26 is formed to a relatively shallow depth (here, with a dopant concentration peak at a depth of about 1000 Å), such reactive ion etching or plasma etching should not etch deeply into base region 26, for example by more than 200 Å, in order to avoid removing a significant amount of the boron dopant and thereby increasing the resistance of the inactive and active base regions to be subsequently formed. Here, excessive etching is avoided in the following manner, it being noted from the outset that the structure depicted in the FIGURES is typically located in a silicon wafer of suitable size, such as a few inches in diameter, containing many similar structures. Thus, a little thought reveals that a major portion of the surface area of such wafer beneath polysilicon layer 28 is covered with the insulating material (here, silicon dioxide) of field oxide regions 16. Reactive ion etching, here performed using a Model 61 Reactive Ion Etcher manufactured by Metals Research Corporation, slightly non-uniformly etches the wafer, here from the edges to the center thereof. It has been found that as polysilicon layer 28, which is somewhat transparent, is removed from the surface of the wafer by the reactive ion etching process, concentric color fringes develop on the wafer, which move radially from the edges to the center of the wafer. The color stops changing in a given region when all of the polysilicon has been removed from the silicon dioxide in that region (i.e., when the silicon dioxide is exposed). Thus, during etching, the color of the wafer visibly changes, beginning at the edges thereof, such color change proceeding from the wafer edges to the center of the wafer. Then, the wafer will stop changing color, beginning at the edges of the wafer and proceeding to the center thereof. Thus, by observing the center of the wafer during reactive ion etching, the color thereof will begin to change when etching of the polysilicon at the center of the wafer starts. As soon as the center of the wafer is observed to stop changing color, the reactive ion etching process is halted. Thus, any etching into base regions 26 of transistor structures located at or near the center of the wafer is substantially prevented. It is noted that some etching into base regions 26 will occur in transistor structures located at or near the edges of the wafer, since etching proceeds from the wafer edges to the center thereof. However, the reactive ion etching process is sufficiently uniform, and the size of the wafer is sufficiently small, so that the desired less than 200 Å will be removed from base regions 26 of such wafer-edge-disposed transistor structures. It is noted that the above-discussed color change may alternately be detected with an optical sensor which would produce a control signal to halt the reactive ion etching process when the sensor detects that the center of the wafer has stopped changing color, thereby enabling the reactive ion etching process to be automated while still avoiding etching deeper than the specified 200° into base region 26.

After the above-discussed etching process is completed, the photoresist layer (not shown in FIG. 4) disposed over polysilicon regions 30, 32 is removed by any conventional process. Thus, an emitter region 30 of n-doped polysilicon and an n-doped polysilicon collector electrode contact 32, each here having a width of between 0.5 $\mu$m and 1.0 $\mu$m, remain on the surface of the structure. It is here noted that emitter region 30 lies completely over base region 26 and, here, collector contact 32 lies partially over epitaxial layer 14 and partially over field oxide region 16 to facilitate electrical connection thereto. It is also noted that emitter region comprises an upper surface 29 and side surfaces 31, as shown in FIG. 4. Likewise, collector contact 32 includes an upper surface 33 and side surfaces 35.

Figure 5:
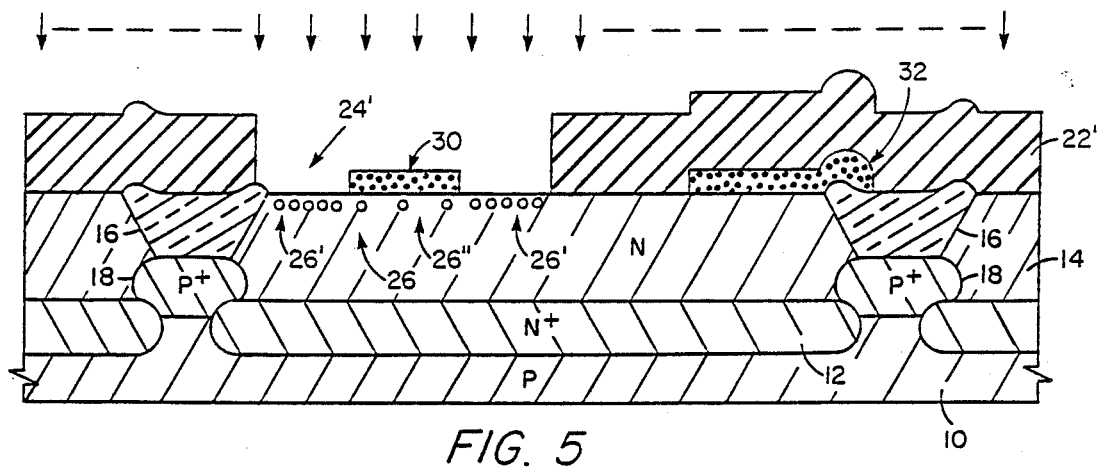

Referring now to FIG. 5, photoresist layer 22' is applied over the structure and patterned to form a window 24' therein exposing doped base region 26 and polysilicon emitter region 30, as shown. It is noted that the surfaces of first portion 26' of base region 26 is exposed by polysilicon emitter region 30, with such emitter region 30 providing a mask over a surface of a second portion 26'' of base region 26. Additional p-type dopant (here boron) is implanted into the first portions 26' of base region 26 unmasked by emitter region 30 to thereby form "inactive" base regions 26', such inactive base region 26' having decreased contact resistance due to such additionally implanted boron. It is noted that polysilicon emitter region 30 acts as a mask to substantially prevent the implanted boron from reaching second portion 26'' of base region 26, thereby forming an "active" base region 26'' having a lower doping concentration, and hence higher contact resistance, than inactive base regions 26'. A little though reveals that active base region 26'' has substantially the same width (here between 0.5 $\mu$m and 1.0 $\mu$m) as emitter region 30. Here the ion implantation boron is accomplished with dosage of approximately $5 \times 10^{13}$ per cm$^2$ at 30 Kev. At this point in the process, the dopant concentration of inactive base regions 26' is on the order of $5 \times 10^{18}$ per cm$^3$. Here, the inactive base region 26' disposed to the left of emitter region 30 in the FIGS. is between 0.75 $\mu$m and 1.25 $\mu$m wide, while that of the inactive base region 26' shown disposed to the right of emitter region 30 is between 0.5 $\mu$m and 0.75 $\mu$m. Photoresist layer 22' is then removed by any conventional process.

Figure 6:
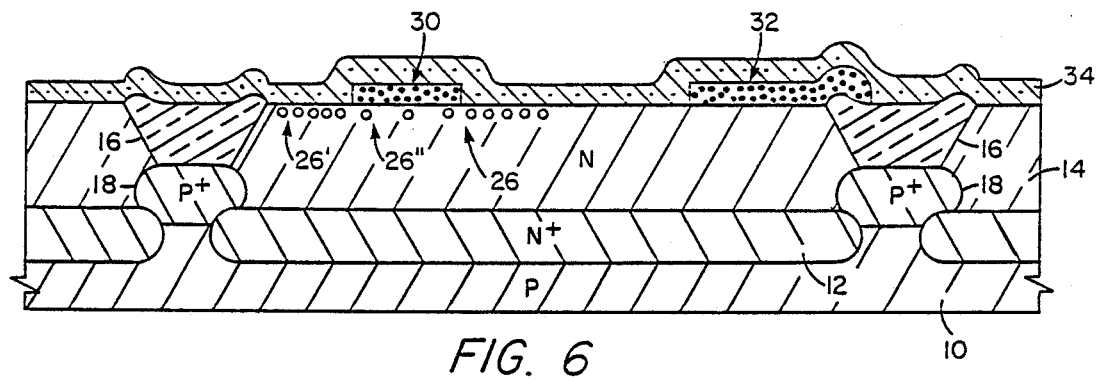
Figure 7:
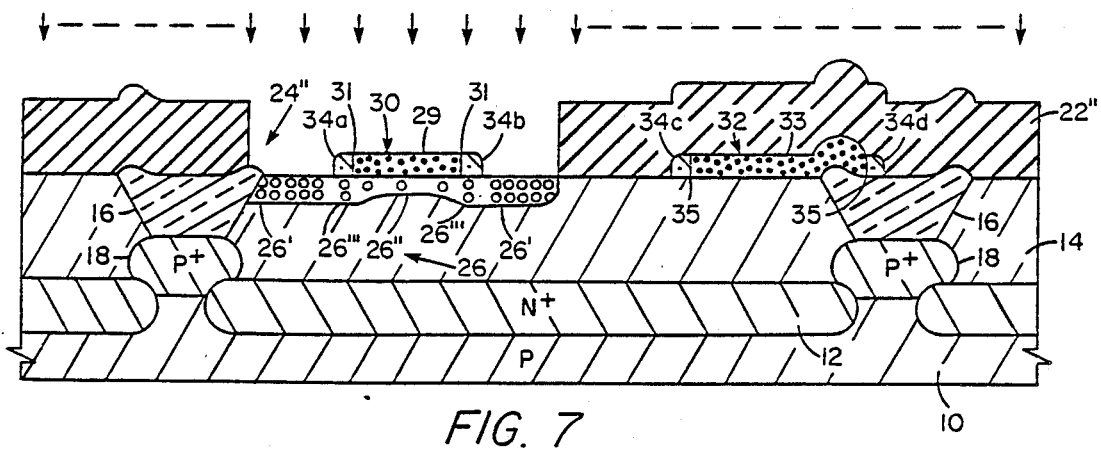

Referring now to FIG. 6, a layer 34 of insulating material (here silicon dioxide) is applied over the surface of the structure, here to a thickness of between approximately 1500 Å and 3000 Å and preferably 2000 Å. Here, such insulating layer 34 is applied by chemical vapor deposition, using SiH$_4$ and O$_2$ at 425° C. The silicon dioxide layer 34 is then anisotropically etched away from the horizontal surfaces thereof; that is, silicon dioxide layer 34 is vertically etched. Here, anisotropic etching is performed using CHF$_3$, commercially available as Freon 13 ™. Referring also to FIG. 7, such vertical or anisotropic etching exposes a portion of the surface of inactive base regions 26' and epitaxial layer 14 and also the upper surfaces 29, 33 (FIG. 4) of emitter region 30 and collector contact 32, respectively. The etching also forms sidewall spacer regions 34a, 34b of insulating material abutting side surfaces 31 of polysilicon emitter region 30 and sidewall spacer regions 34c, 34d of insulating material abutting side surfaces 35 of polysilicon collector contact 32. Sidewall spacer regions 34a–34d here each have a width of between 1000 Å and 2500 Å.

Here, photoresist layer 22'' is subsequently deposited over the structure and patterned to form a window 24'' therein, exposing base region 26, polysilicon emitter region 30 and insulating spacers 34a, 34b, as shown. It is noted that polysilicon emitter region 30 and abutting insulating spacers 34a, 34b provide a mask over active base region 26'' (disposed below emitter region 30) and those portions 26''' of inactive base regions 26' disposed beneath insulating spacers 34a, 34b. An additional level of boron here is implanted into the portions of inactive base regions 26' unmasked by emitter region 30 and spacers 34a, 34b to further reduce the contact resistance of such unmasked portions of inactive base regions 26'. Here, such ion implantation step is at a dosage not exceeding $5 \times 10^{14}$ per cm$^2$ at about 30 Kev to provide a dopant concentration on the order of $5 \times 10^{19}$ per cm$^3$ in such unmasked portions of inactive base regions 26'. It is noted that such dosage may be increased to increase the dopant concentration in inactive base region 26'; however, in such case photoresist layer 22" should alternately be patterned to additionally mask emitter region 30 to prevent undesired excessive compensation of the arsenic dopant in emitter region 30 by the implanted boron. Then, photoresist layer 22" is removed in any conventional manner. The structure is then heated, here to about 950° centigrade for approximately 20 to 30 minutes, to diffuse the implanted arsenic in the emitter polysilicon region 30 downward through such polysilicon region and somewhat into the active base region 26", to anneal out crystal imperfections in active base region 26", and to activate the dopant. The heating process is halted when the optimum transistor gain is reached. It has been found that spacers 34a, 34b substantially prevent the implanted arsenic in emitter region 30 from outdiffusing into inactive base regions 26', which would increase the contact resistance of inactive base regions 26' by decreasing the net p-type dopant concentration therein.

It is noted that the ion implantation step associated with FIG. 7 is performed after spacer regions 34a, 34b have been formed abutting sides 31 of emitter contact 30. A little thought thus reveals that here base region 26 has three regions having three different dopant concentrations at the conclusion of the ion implantation step of FIG. 7: (1) inactive base regions 26' having a relatively heavy dopant concentration (on the order of $5 \times 10^{19}$ per cm$^3$); (2) active base region 26" having a relatively light dopant concentration (on the order of $1 \times 10^{18}$ per cm$^3$); and (3) regions 26''' of inactive base regions 26' disposed beneath spacers 34a, 34b and having a doping concentration between that of the remainder of inactive base regions 26' and active base region 26" (on the order of $5 \times 10^{18}$ per cm$^3$). Thus, each region 26''' provides a transition region (having a width approximately equal to that of a sidewall spacer 34a, 34b) between the relatively heavy doping concentration of inactive base regions 26' and the more lightly doped active base region 26" to thereby maintain a relatively high reverse breakdown voltage between the base and emitter, here between 4 and 7 volts. It is noted that the additional ion implantation step of FIG. 7 also decreases the contact resistance, that is the lateral resistance, of the inactive base region 26' (and hence reduces the electrical resistance between the base and emitter of the transistor device), and additionally reduces the epidermal (or "up-down") resistance of the inactive base regions 26' by a factor of 3 to 5.

Figure 8:
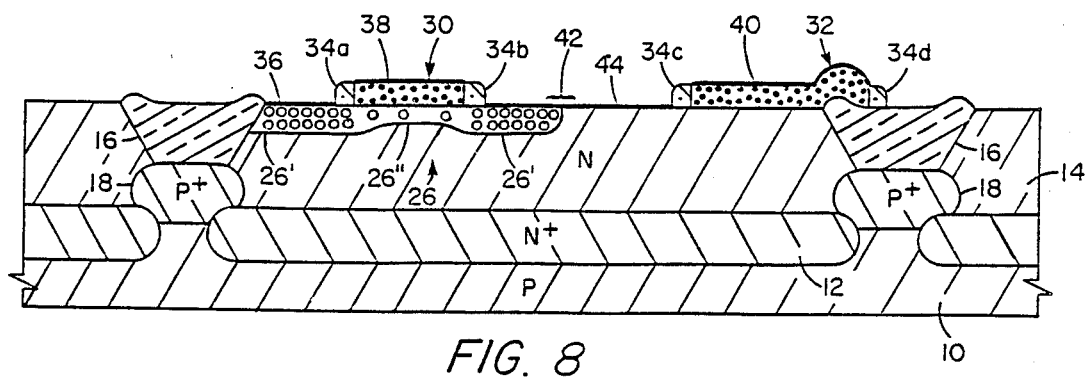

Referring now to FIG. 8, a metal layer, here titanium (although other metals such as cobalt, platinum or palladium may alternately be employed), is next deposited over the entire surface of the structure and the structure is heated in a conventional manner to produce an alloying reaction between the deposited titanium and exposed silicon surfaces (such as the surfaces of inactive base regions 26' not covered by spacers 34a, 34b, upper surfaces 29, 33 of emitter region 30 and collector contact 32, respectively, and the surface of epitaxial layer 14 therebetween), forming metal silicide contacts on such exposed silicon surfaces. As is known, such metal will not so react with silicon dioxide (i.e., sidewall spacers 34a-34d and field oxide regions 16). The unreacted metal is removed in any conventional manner (here using hydrogen peroxide to remove unreacted titanium) to thereby form self-aligned silicide contacts 36, 38, 40 on the surface of a portion of inactive base region 26', upper surface 29 of emitter region 30 and upper surface 33 of collector contact 32, respectively, of the bipolar transistor device, as shown. As is known, the formation of silicide on the base, emitter and collector contact surfaces of the bipolar transistor substantially reduces the vertical and lateral resistance of such contacts. As also shown in FIG. 8, here an additional silicide layer 44 is formed on the surface of epitaxial layer 14 and inactive base region 26' between emitter region 30 and collector contact 32, and hence over a junction region 42 formed between such portion of the p-type conductivity inactive base region 26' and the n-type conductivity epitaxial layer 14 at the surface of the structure. That is, silicide layer 44 is formed over the p-n junction formed between the p-type inactive base region 26' and the n-type epitaxial layer 14, thereby forming a Schottky diode junction therebetween. Thus, the bipolar transistor is seen to be "Schottky clamped" between the base region and the collector region thereof. It is noted that if such Schottky diode is not desirable in a given application, the formation thereof may be prevented by disposing a photoresist mask (not shown) over that portion of silicon dioxide layer 34 (FIG. 6) which overlies the surface junction 42 (FIG. 8) between p+-type conductivity inactive base region 26' and n-type epitaxial layer 14. Thus, a portion of silicon dioxide layer 34 will remain over junction 42 after the anisotropic etching of insulating layer 42, thereby preventing formation of silicide over junction 42.

Silicon dioxide sidewall spacers 34a-34d provide electrical isolation between adjacently disposed silicide contacts 36, 38, 40, 44. That is, insulating spacer 34a provides electrical isolation between base silicide contact 36 and emitter silicide contact 38. Likewise, sidewall spacer 34b insulates emitter silicide contact 38 from Schottky silicide layer 44. Further, silicon dioxide spacer 34c prevents Schottky silicide contact 44 from short-circuiting with collector silicide contact 40.

Figure 9:
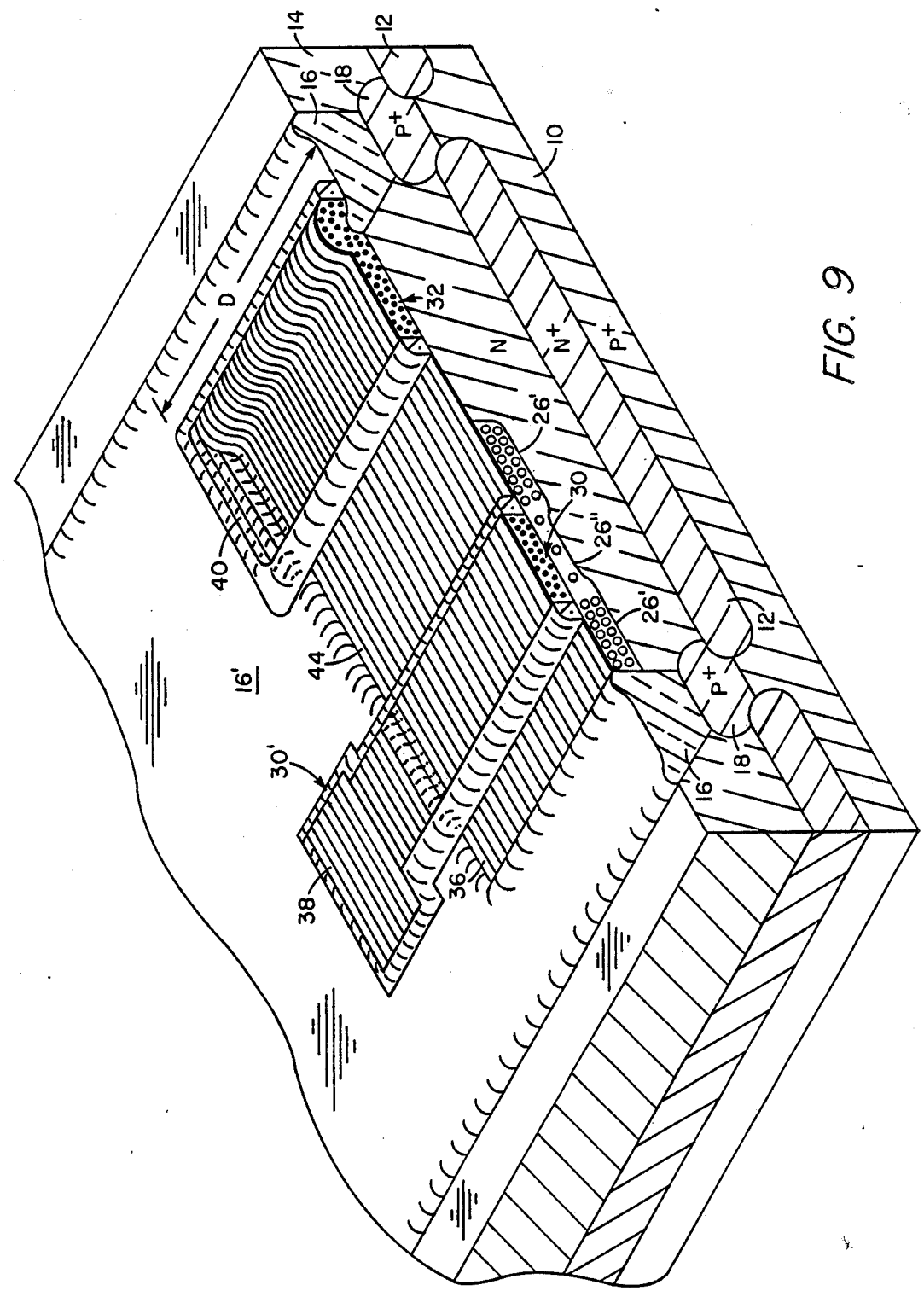
FIG. 9 is an isometric view of the bipolar transistor fabricated according to the embodiment illustrated in FIGS. 1–8 and 10 at one step in the manufacture thereof.
Figure 10:
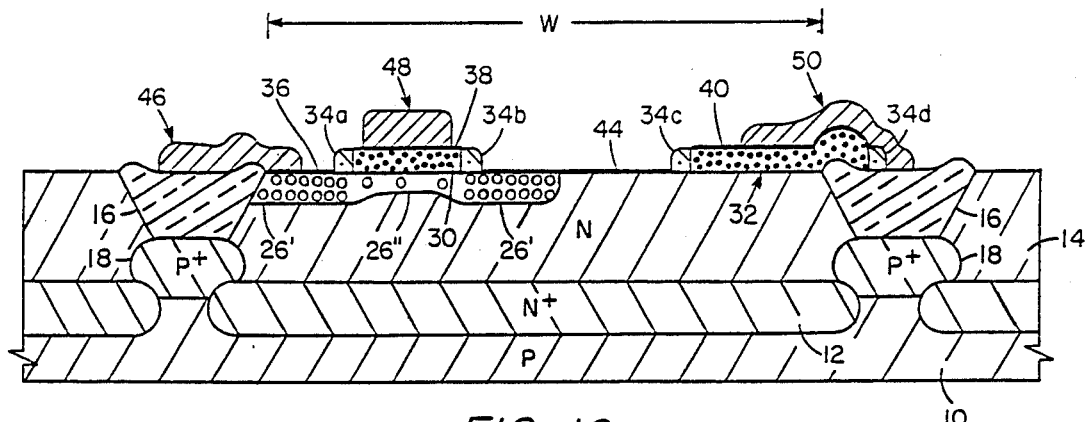

Referring now to FIG. 9, an isometric view of the structure of FIG. 8 is shown. Here, collector contact 32 and silicide contacts 36, 40, 44 have a depth D of approximately 3 μm. Here, emitter region 30 comprises an extended and enlarged region 30', over which silicide contact 38 is also deposited, to facilitate connection to emitter region 30 with an electrode. Here, the extended and enlarged region 30' of emitter region 30 is disposed over field oxide region 16' running perpendicularly between field oxide regions 16, as shown. Referring also to FIG. 10, metal electrodes 46, 48, 50, here comprising TiW and aluminum or titanium and gold, are deposited on the structure using conventional photolithographic techniques to form the base, emitter and collector electrodes, respectively, of the bipolar transistor. Alternately, such electrodes 46, 48, 50 may be deposited by conventional selective chemical vapor deposition of tungsten. It is noted that the base and collector electrodes 46, 50 may be deposited in the device area or additionally over the field oxide regions 16 to facilitate alignment of such electrodes 46, 50 with inactive base region 26' and collector contact 32, respectively. Also, emitter electrode 48 may be deposited in the device area or on polysilicon extension 30' (FIG. 9).

With the above-described process of the present invention the overall width, W (FIG. 10), of the bipolar transistor may be substantially reduced, such as to 5 μm or less, from that obtainable by conventional methods (on the order of 8 to 10 μm) due to the use of insulating sidewall spacers 34a-34d to provide electrical isolation between base, emitter and collector silicide contacts 36, 38, 40 and Schottky silicide contact 44. Particularly, the spacing between base silicide contact 36 and emitter silicide contact 38 may be reduced to between 0.1 μm (1000 Å) and 0.25 μm (2500 Å), the width of sidewall spacer 34a, thereby lowering the transistor's base-to-emitter resistance. The reduced transistor width results in a smaller inactive base region 26' over which base electrode 46 is disposed, thereby reducing the contact or lateral resistance thereof as well as the "up-down" resistance thereof. Further, such smaller inactive base region reduces the base-to-collector capacitance of the bipolar transistor. Therefore, the transistor's high-frequency power gain and operating speed are increased.

Figure 11:
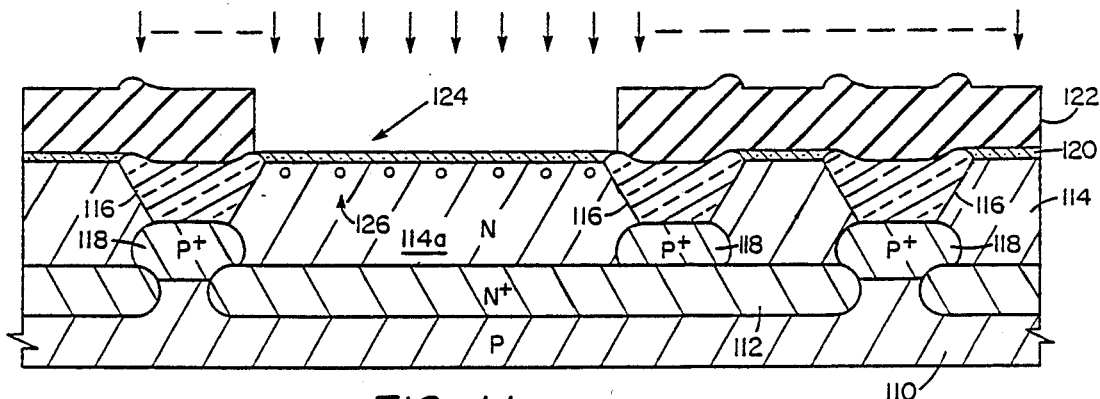
FIGS. 11–18 are cross-sectional elevation views of a multi-base, multi-emitter bipolar transistor fabricated according to a second embodiment of the present invention at various steps in the manufacture thereof.
Figure 12:
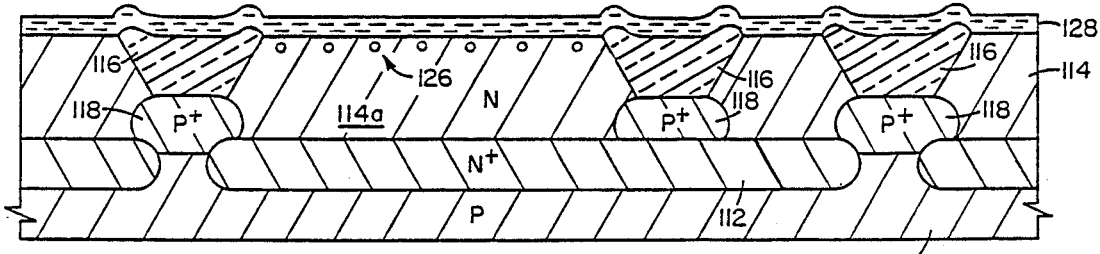
Figure 13:
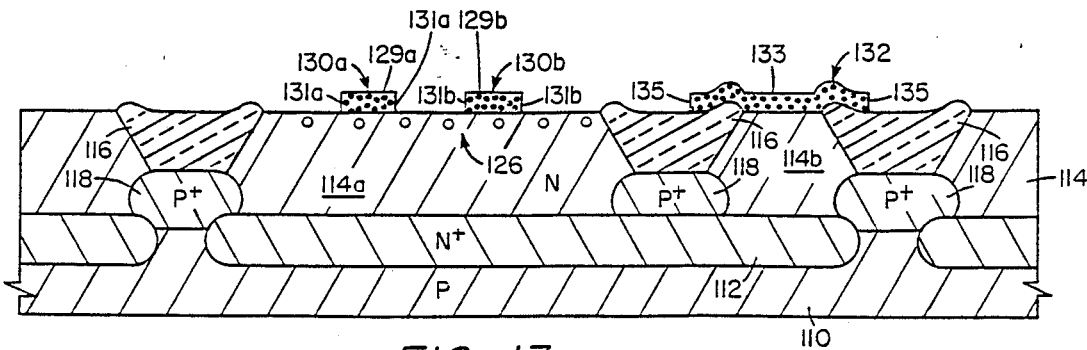

Referring now to FIGS. 11–18, shown is a second embodiment of the process of the present invention, in which a bipolar transistor having interdigitated multiple base and emitter regions is formed. FIG. 11 depicts the structure in the same stage of production as that of FIG. 2 of the first embodiment, although it is noted that an additional field oxide region 116 and p+-type channel stop 118 are shown for purposes to be described. Here, the thicknesses, conductivity types and dopant concentrations of p-type substrate 110, n+-type buried layer 112 and n-type epitaxial layer 114 are substantially the same as in the embodiment of FIGS. 1–9. As shown in FIG. 11, photoresist layer 122 is deposited over the structure and patterned to form a window 124 therein exposing an area 114a of epitaxial layer 114 and a thin oxide layer 120 (here, between 150 Å and 250 Å and preferably 200 Å thick) previously formed over epitaxial layer 114. Then, a suitable p-type conductivity dopant (here boron) is ion implanted (here at a dosage of $1 \times 10^{13}$ per cm$^2$ at 30 KeV) to form a p-type base region 126, as shown. Referring to FIG. 12, after photoresist layer 122 and thin oxide layer 120 are removed, a layer 128 of polysilicon is deposited, here to a thickness of approximately 2500 Å, and then is suitably doped, here with arsenic implanted at a dosage of between $5 \times 10^{15}$ and $1 \times 10^{16}$ per cm$^2$ at 150 KeV. Referring to FIG. 13, a photoresist layer (not shown) is deposited over the structure and patterned to cover a plurality, here two, of regions 130a, 130b of polysilicon layer 128 disposed over base region 126 and a region 132 of polysilicon layer 128 disposed over an area 114b of epitaxial layer 114 separated from epitaxial layer area 114a by a field oxide region 116 and channel stop 118, as shown, but electrically coupled thereto by subcollector region 112. The remainder of polysilicon layer 128 is etched away (here by reactive ion etching) to form a plurality (here two) of polysilicon emitter regions 130a, 130b and a polysilicon collector contact 132. It is noted that such reactive ion etching should not cut more than 200 Å into base region 126, and the procedure described above for so limiting the depth of the reactive ion etch is equally applicable here. Then, the previously deposited photoresist (not shown) is removed. As shown, emitter region 130a comprises upper surface 129a and side surfaces 131a. Likewise, emitter region 130b includes upper surface 129b and side surfaces 131b. Similarly, collector contact 132 includes upper surface 133 and side surfaces 135.

Figure 14:
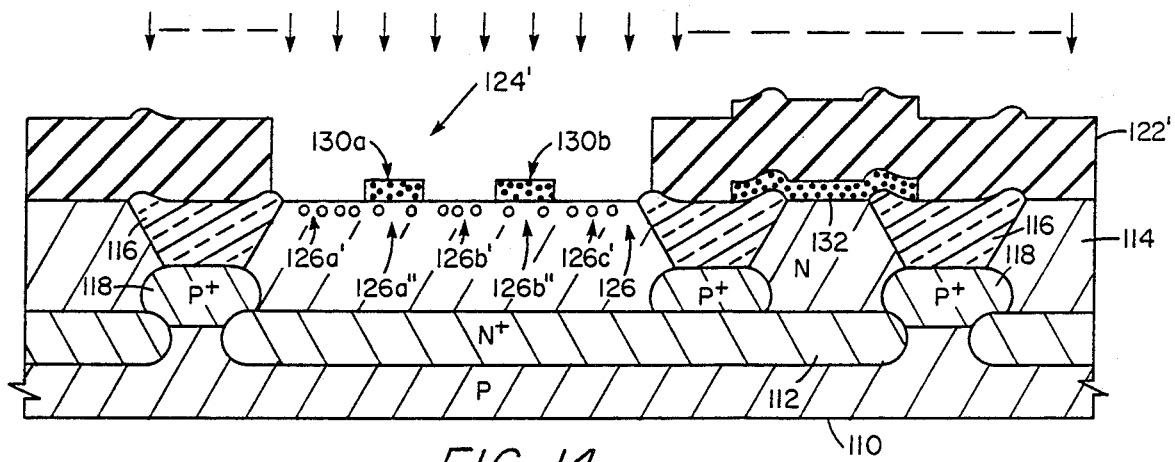

Referring next to FIG. 14, photoresist layer 122' is deposited and window 124' formed therein exposing base region 126 and emitter regions 130a, 130b. It is noted that first portions 126a', 126b', 126c' of base region 126 are exposed by window 124' and second portions 126a", 126b" of base region 126 are masked by polysilicon emitter regions 130a, 130b. Additional boron is then ion implanted (here at $5 \times 10^{13}$ per cm$^2$, 30 KeV) to increase the p-type dopant concentration of first portions 126a', 126b', 126c'. Thus, first portions 126a', 126b', 126c' become the inactive base regions of the transistor and second portions 126a", 126b" become the active base regions thereof.

Figure 15:
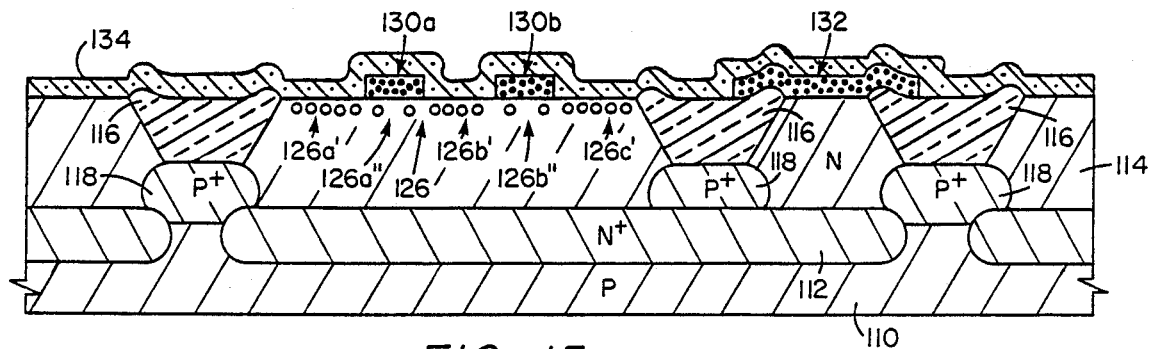
Figure 16:
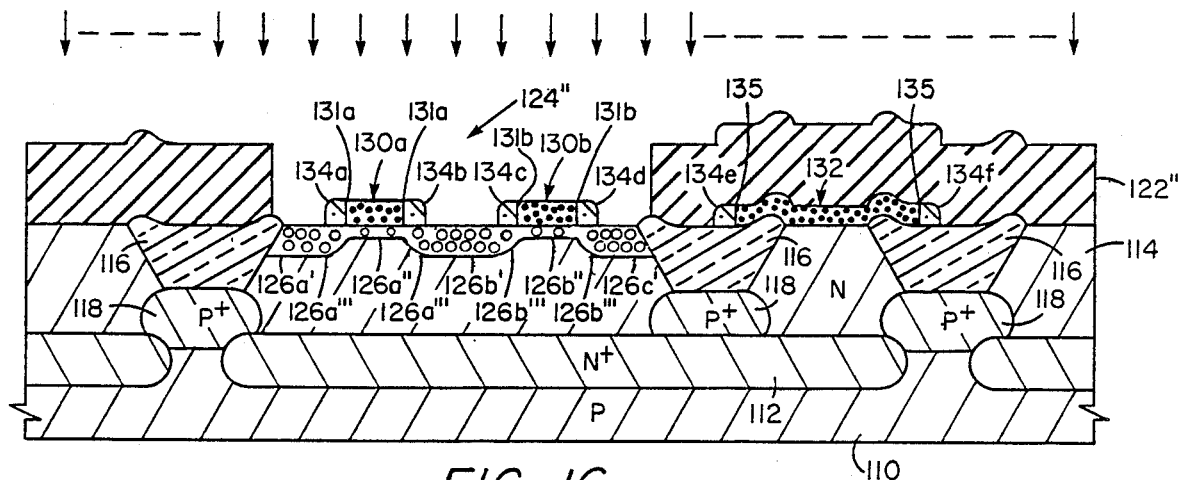

Referring to FIG. 15, an insulating layer 134 of, here, silicon dioxide is conventionally applied over the structure, here to a thickness of between approximately 2000 Å and 3000 Å and preferably 2000 Å. Such insulating layer 134 is then anisotropically etched away from horizontal surfaces (i.e., vertically etched) in the manner described above, thereby exposing the upper surfaces of emitter regions 130a, 130b and collector contact 132, and also exposing portions of the surfaces of inactive base regions 126a', 126b', 126c'. Such etching also forms insulating sidewall spacers 134a–134f abutting the sides of polysilicon emitter regions 130a, 130b and polysilicon collector contact 132, respectively, as shown in FIG. 16. That is, insulating spacers 134a, 134b abut side surfaces 131a of emitter region 130a, insulating spacers 134c, 134d abut side surfaces 131b of emitter region 130b, and spacers 134e, 134f abut side surfaces 135 of collector contact 132. Here, each insulating spacer is between 1000 Å and 2500 Å wide.

If desired, a third photoresist layer 122" may be deposited and patterned to form window 124", as shown in FIG. 16, and additional boron ion implanted (here at a dosage of up to $5 \times 10^{14}$ per cm$^2$, 30 KeV) through window 124" and into the portions of inactive base regions 126a', 126b', 126c' exposed by emitter regions 130a, 130b and sidewall spacers 134a–134d to further reduce the contact resistance thereof. As discussed, if a greater dosage is desired, photoresist layer 122" should also mask emitter regions 130a, 130b to prevent excessive compensation of the arsenic dopant therein by the implanted boron. It is noted that polysilicon emitter contacts 130a, 130b and abutting silicon dioxide spacers 134a–134d provide masks over active base regions 126a", 126b" and those portions of inactive base regions 126a', 126b', 126c' disposed below sidwalls 134a–134d. Thus, dopant transition regions 126a''', 126b''' are formed beneath such sidewalls between the rather heavily doped inactive base regions 126a', 126b', 126c' and the more lightly doped active base regions 126a", 126b", such transition regions having a dopant concentration between that of the inactive and active base regions. As discussed, such arrangement increases the base-emitter reverse breakdown voltage. Then, photoresist layer 122" is removed by any conventional method. The structure is then heated (here at 950° C. for 20–30 minutes) to diffuse the implanted arsenic in regions 130a, 130b through the polysilicon thereof and somewhat into active base regions 126a", 126b", to anneal such base regions 126a", 126b" and to activate the dopant.

Figure 17:
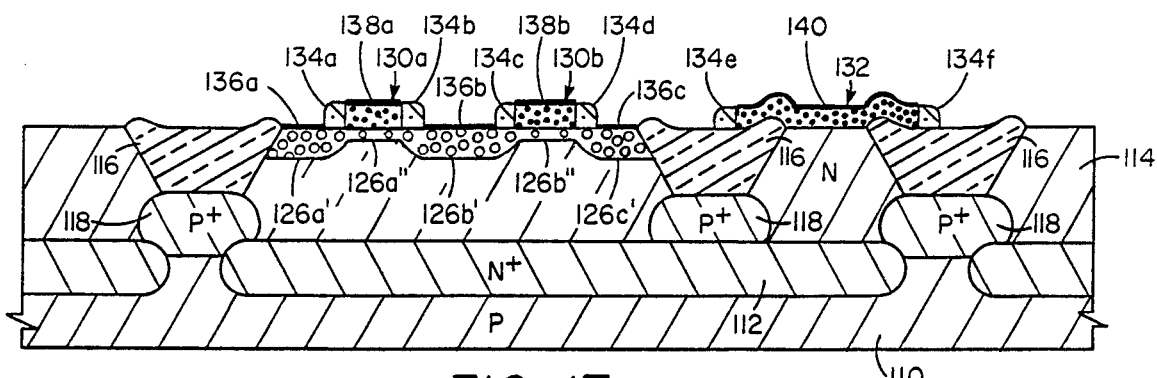
Figure 18:
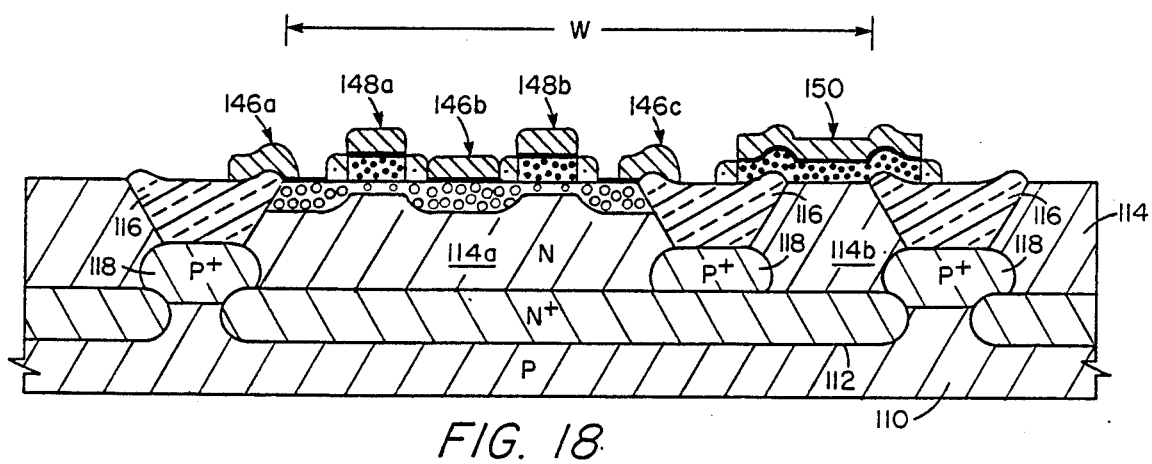

Referring now to FIG. 17, a metal layer, here titanium, is applied over the entire surface of the structure, and the structure heated sufficiently to produce an alloying reaction between the titanium and silicon surfaces. Thus, base silicide contacts 136a, 136b, 136c are formed on the surfaces of inactive base regions 126a', 126b', 126c', respectively. Further, emitter silicide contacts 138a, 138b are formed on the surfaces of polysilicon emitter regions 130a, 130b. Likewise, collector silicide contact 140 is formed on the surface of polysilicon collector contact 132. As discussed, the deposited metal does not react with insulating material (such as silicon dioxide spacers 134a–134f and field oxide regions 116). Thus, after such unreacted titanium is removed (here using hydrogen peroxide), silicide contacts 136a, 138a, 136b, 138b, 136c, 140 are electrically isolated from each other by sidewalls 134a–134f. Referring to FIG. 18, metal electrode connections 146a, 146b, 146c, 148a, 148b, 150 (here comprising TiW) are made with silicide contacts 136a, 136b, 136c, 138a, 138b, 140, respectively, as shown. Thus, the transistor structure illustrated in FIG. 18 comprises three base electrodes 146a, 146b, 146c, two emitter electrodes 148a, 148b, and a collector electrode 150.

Referring again to FIG. 17 it is noted that base silicide contacts 136a, 136b, 136c are self-aligned and closely spaced from self-aligned emitter silicide contacts 138a, 138b by respective insulating spacers 134a–134d. That is, adjacent ones of such silicide contacts are separated by only the width (here, between 1000 Å and 2500 Å) of a spacer. Thus, as discussed in detail above, the overall width W (FIG. 18) of the transistor is reduced, as is the base-to-emitter resistance thereof, due to the close spacing between such base silicide contacts (136a, 136b, 136c) and emitter silicide contacts (138a, 138b). The interdigitated multiple-base, multiple-emitter bipolar transistor thus formed has increased power capability over single-base, single-emitter transistors, and improved high frequency power gain over conventional multiple-emitter transistors due to the reduced base-to-emitter resistance thereof. The collector contact here is made between n-type epitaxial layer areas 114a, 114b via n+-type buried subcollector 112. If desired, the portion of epitaxial layer 114 disposed beneath collector contact 132 may be doped with added n-type conductivity dopant (e.g., ion implanted phosphorous) to decrease the collector resistance of the transistor.

In still another embodiment of the present invention, shown in FIGS. 19–27, bipolar transistors of reduced size (as discussed above) may be formed together with complementary metal oxide semiconductor (CMOS) field effect transistors on the same substrate to provide a so-called "Bi-CMOS" structure. Referring to FIG. 19, a substrate 210, here comprising p-type conductivity silicon with a surface in the <100> or <111> crystallographic plane, is here provided having a dopant concentration on the order of $10^{15}$ atoms per $cm^2$. Here, an n+-type conductivity subcollector region 212 is formed in a conventional manner only in those areas of substrate 210 over which will be formed bipolar transistors, although subcollector region 212 may also be formed in areas of substrate 210 which will support n-wells for CMOS transistors to be subsequently fabricated as described hereinafter. Subcollector region 212 here is formed with a thickness of about 1.5 μm and a doping concentration on the order of $10^{20}$ atoms per $cm^3$. Next, epitaxial layer 214 of n-type conductivity silicon is grown over substrate 210, here to a thickness of approximately 1.5 μm to 2.0 μm with a dopant concentration between approximately $5 \times 10^{15}/cm^3$ and $2 \times 10^{16}/cm^3$.

Here, it is desirable to provide the epitaxial layer n-wells and p-wells of the CMOS transistors with doping concentrations on the order of $10^{17}/cm^3$, while optimum dopant concentration for epitaxial layer 214 in the areas of the bipolar transistors is somewhat less, here a maximum about $2 \times 10^{16}/cm^3$. Thus, in accordance with an additional feature of the present invention, Applicant provides a process for driving implanted dopant (i.e. impurities) to a predetermined depth in an area of epitaxial layer 214 while substantially preventing loss of dopant therefrom by evaporation and contamination of adjacent areas of epitaxial layer 214 by such evaporated dopant. Here, additional impurities are implanted into areas 214a, 214b of epitaxial layer 214 wherein n-wells and p-wells, respectively, for the CMOS transistors will be formed, while areas of epitaxial layer 214 wherein bipolar transistors will be formed are shielded from such additional dopant implantation. Insulating layer 202, here comprising silicon dioxide ($SiO_2$), is grown on the surface of the structure to a thickness of about 1200 Å in a conventional manner, here by heating the structure at about 1000° C. for about 12 minutes in a steam atmosphere. Then, layer 204a of photoresist material is deposited over $SiO_2$ layer 202 and patterned to form a window 205a therein, thereby exposing an area 214a of epitaxial layer 214 in which a CMOS n-well will be formed. It is noted that layer 204a masks areas 214b, 214c of epitaxial layer 214. Next, a suitable n-type conductivity dopant, here phosphorus, is ion implanted through window 205a and $SiO_2$ layer 202 into epitaxial layer area 214a, here at a dosage of $1.3 \times 10^{14}/cm^2$ at 200 Kev. Referring now to FIG. 20, photoresist layer 204a is conventionally removed and a second layer 204b of photoresist is deposited over $SiO_2$ layer 202 and patterned to form window 205b therein exposing an are 214b of epitaxial layer 214 in which a CMOS p-well will be formed. It is noted that photoresist layer 204b masks both epitaxial layer areas 214a, 214c. Then, a suitable p-type conductivity dopant, here boron, is ion implanted (here at a dosage of $2.5 \times 10^{13}/cm^2$ at 200 Kev) through window 205a into epitaxial layer area 214b. Thus, it is noted that the dopant concentration of epitaxial layer areas 214a, 214b (which will become CMOS n- and p-wells, respectively) are increased, while that of epitaxial layer area 214c, which will become a bipolar transistor collector region, remains unchanged.

Figure 21:
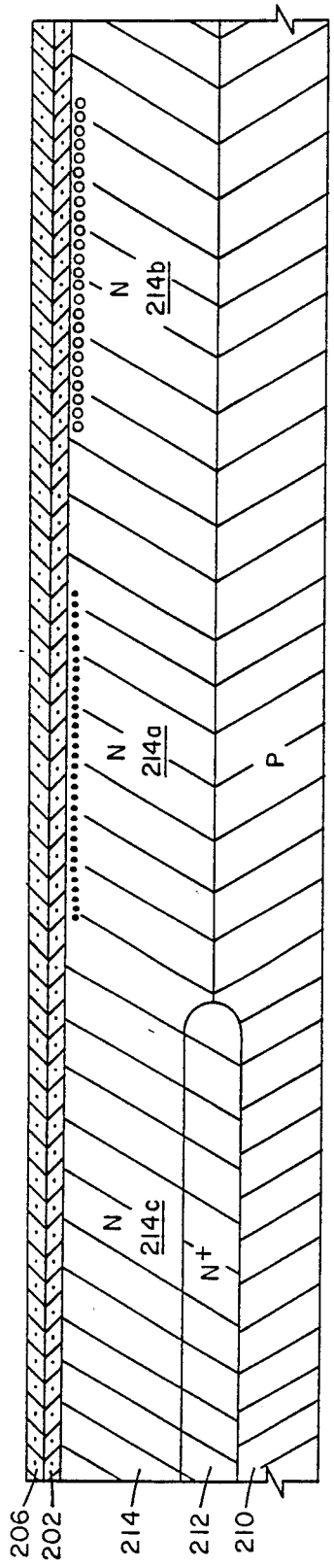

Referring now to FIG. 21, photoresist layer 204b is removed and a layer 206 of silicon nitride ($Si_3N_4$) is deposited over $SiO_2$ layer 202 at a temperature of about 800° C. to a thickness between approximately 500 Å and 1500 Å, and here preferably to a thickness of about 1500 Å. The thickness of layer 206 in a given application will depend on the concentration of the dopant to be driven through the semiconductor layer and the duration of the drive cycle. However, the $Si_3N_4$ expands at a different rate than the silicon of epitaxial layer 214 during the drive cycle. Thus, if layer 206 is made too thick, such $Si_3N_4$ layer 206 will crack. After deposition of $Si_3N_4$ layer 206, the structure is heated (here, in nitrogen at between 800° C. and 1200° C., preferably about 900° C., for approximately 20 minutes) to anneal the silicon. Next, the structure is further heated at an increased temperature, here within the range from 900° C. to 1200° C. and preferably at approximately 1100° C. for a predetermined time, here between 6 hours and 10 hours and preferably about 6.5 hours, to drive the n- and p-type dopant in epitaxial layer areas 214a, 214b, respectively, downward through such epitaxial layer areas 214a, 214b to distribute such dopant therein. Here, the temperature and time duration of the above-described drive cycle is selected to drive the n-type and p-type dopant to a depth of approximately 2 μm in epitaxial layer areas 214a, 214b, respectively. It is noted that the n-type dopant in epitaxial layer area 214a and the p-type dopant in epitaxial layer 214b are driven downward simultaneously, rather than in separate drive cycles as is conventional. Applicant has found that Si$_3$N$_4$ layer 206 seals (i.e., provides a "cap" over) epitaxial layer areas 214a, 214b to substantially prevent the loss by evaporation of n-type and p-type dopants, respectively, therefrom by evaporation during the single dopant drive cycle. Thus, unwanted transfer of dopant (i.e., "autodoping") between epitaxial layer areas 214a, 214b and between epitaxial layer areas 214a, 214b and other areas of epitaxial layer 214 (such as bipolar transistor area 214c) is substantially prevented.

Figure 22:
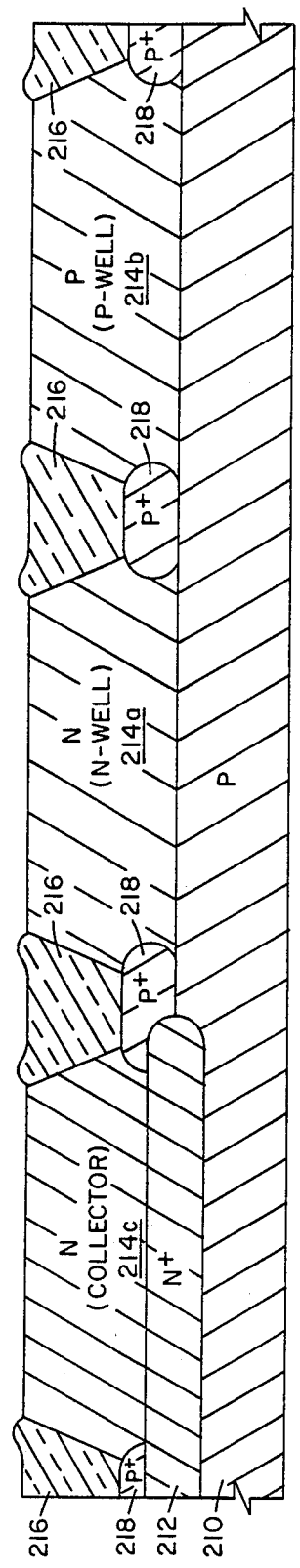

Referring now to FIG. 22, insulating regions 216 (here, SiO$_2$) and p$^+$-type conductivity silicon channel stops 218 are formed in epitaxial layer 214, here according to the process described in U.S. Pat. No. 4,569,698, issued to Wolfgang M. Feist on Feb. 11, 1986 and assigned to the present assignee. During such process, Si$_3$N$_4$ layer 206 and SiO$_2$ layer 202 are removed. Thus, as shown in FIG. 22, the structure comprises a plurality (three being shown) of electrically isolated regions: CMOS n-well 214a; CMOS p-well 214b; and bipolar transistor region 214c. Referring to FIG. 23, a thin layer comprising regions 220a, 220b, 220c of SiO$_2$, here between 150 Å and 250 Å and preferably 230 Å thick, is grown over epitaxial layer areas 214a, 214b, 214c, respectively (such as by heating the structure to 900° C. in oxygen for 50 minutes). A layer 222 of photoresist is then deposited and patterned to form a window 224 therein. A suitable p-type conductivity dopant, here boron, is ion implanted (here at a dosage of $1 \times 10^{13}$/cm$^2$ at 30 Kev) through window 224 and thin SiO$_2$ layer 220c to form p-type base region 226 of about 1000 Å in depth in bipolar epitaxial layer area 214c, as previously described in connection with FIG. 2. It is noted that such dopant is prevented from entering CMOS n-well 214a or CMOS p-well 214b by photoresist layer 222. Such photoresist layer 222 is then removed and a photoresist layer (not shown) is deposited to mask SiO$_2$ layers 220a, 220b and oxide layer 220c is selectively removed from bipolar transistor region 214c, here with hydrofluoric acid.

Referring now to FIG. 24 (and also to FIGS. 3 and 4 and the accompanying descriptions thereof), a layer of polysilicon, here having a thickness of about 2500 Å, is deposited over the surface of the structure. Then, as previously discussed, the portion of such polysilicon overlaying the bipolar transistor 256 and which will subsequently be patterned to form an emitter region 230 and collector contact 232 is doped with a suitable n-type dopant, such as arsenic, while the remainder of such polysilicon layer is masked by a layer of photoresist (not shown), After removal of such photoresist layer, another photoresist mask, not shown, is deposited over the polysilicon and is selectively patterned to cover only selected regions 230, 232, 252g, 254g of such polysilicon layer which will become, respectively: the emitter region of bipolar transistor 256; the collector contact of bipolar transistor 256; the gate electrode of a p-channel MOSFET 252; and the gate electrode of an n-channel MOSFET 254. The remaining portions of the polysilicon layer are then removed, here preferably by the reactive-ion-etching method discussed above. As is known, optimum electrical characteristics for CMOS transistors 252, 254 are achieved with an n-doped polysilicon gate 254g for n-channel MOSFET 254 and a p-doped polysilicon gate 252g for p-channel MOSFET 252. Thus, photoresist layer 258 is deposited over the surface of the structure and patterned to form a first window 260a therein, exposing polysilicon gate electrode 254g, drain region 254d and source region 254s of n-channel MOSFET 254. It is noted that a portion 255 of MOSFET 254 is masked by photoresist layer 258, for purposes to be explained. Photoresist layer 258 is further provided with a second window 260b exposing a portion 253 of p-channel MOSFET 252. A suitable n-type conductivity dopant, here arsenic, is implanted through windows 260a, 260b, here at a dosage of $4 \times 10^{15}$/cm$^2$ at 160 Kev. Such implantation step forms n-type conductivity gate, source and drain regions 254g, 254s, 254d for n-channel MOSFET 254 (i.e., in p-well 214b) and n-type conductivity substrate (i.e. n-well) contact 253 for p-channel MOSFET 252 (i.e., in n-well 214a). Photoresist layer 258 is then removed by any conventional method.

Referring to FIG. 25, a layer 262 of photoresist is deposited over the structure and patterned to form a first window 264a therein gate electrode 252g, source region 252s and drain region 252d of p-channel MOSFET 252, while masking contact region 253 thereof, as shown. Photoresist layer 262 is also patterned with a second window 264b exposing substrate (p-well) contact region 255 of n-channel MOSFET 254. Further, and referring also to FIG. 5, photoresist layer 262 is provided with a third window 264c (analogous to window 24' in photoresist layer 22' of FIG. 5) exposing base region 226. Next, silicon is here ion implanted through windows 264a, 264b, 264 c in two doses of $1 \times 10^{15}$/cm$^2$ at 100 Kev and $6 \times 10^{14}$/cm$^2$ at 60 Kev, respectively, followed by ion implantation of a suitable p-type conductivity dopant (here boron in the form of BF$_2$ at a dosage of about $5 \times 10^{14}$/cm$^2$ at 90 Kev). It is noted that such boron dosage may be increased, such as to about $2 \times 10^{15}$/cm$^2$, to provide heavier doping of the exposed portions of base region 226 and source and drain regions 252s, 252d; if so, however, photoresist layer 262 should also be patterned to mask emitter region 230 to prevent excessive compensation of the arsenic dopant therein by the implanted boron. The implanted silicon amorphizes the portions of epitaxial layer 214 exposed by windows 264a, 264b, 264c, thereby preventing channeling of the implanted boron and thus reducing the p-n junction depth of MOSFETs 252, 254 and bipolar transistor 256 (which should be as shallow as possible for submicron transistors). It is noted that the implanted boron forms inactive base regions 226' in those portions of base region 226 unmasked by polysilicon emitter region 230, with the remaining portion 226" of base region 226 masked by emitter region 230 becoming the active base region of bipolar transistor 256, as discussed above with reference to FIG. 5. Thus, it is noted that the masking step of FIG. 5 may be combined with that of FIG. 25 when fabricating bipolar and MOS transistors together (i.e., Bi-CMOS), thereby saving a masking step. Photoresist layer 262 is then removed in any conventional manner.

Figure 27:
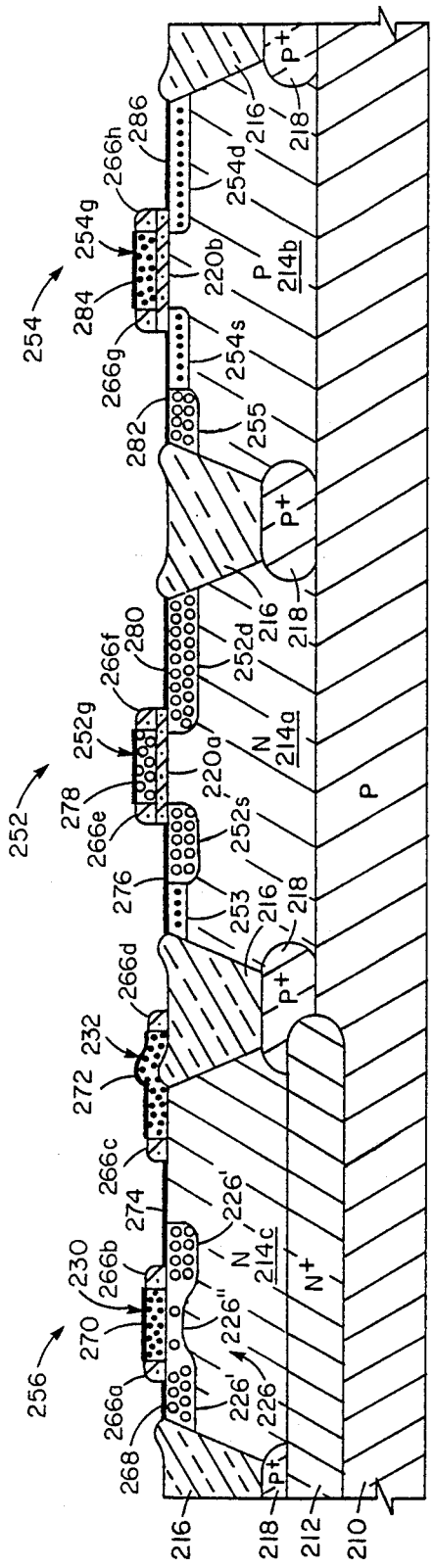

Referring now to FIG. 26, an insulating layer 266, here comprising SiO$_2$, is deposited to a thickness of between 1500 Å and 3000 Å, here to approximately 2000 Å in thickness, over the entire surface of the structure in the manner discussed above in connection with FIG. 6. Referring additionally to FIG. 27, silicon dioxide layer 266 is then anisotropically etched away from horizontal surfaces (i.e., vertically etched), here using CHF$_3$, commercially available as Freon 13 TM. As previously discussed, such vertical etching of SiO$_2$ layer 266 exposes the upper surfaces of emitter region 230 and collector contact 232 and also a portion of the surface of inactive base region 226', while forming insulating sidewall spacers 266a, 266b on each side of polysilicon emitter region 230 and insulating spacers 266c, 266d abutting each side of collector contact 232. Further, such etching exposes the upper surfaces of gate electrodes 252g, 254g, and portions of the surfaces of source regions 252s, 254s, and drain regions 252d, 254d, while forming insulating sidewall spacers 266e, 266f abutting each side of MOS gate electrode 252g and spacers 266g, 266h disposed abutting each side of MOS gate electrode 254g. Each insulating spacer 266a-266h has a width of between 1000 Å and 2500 Å. It is noted that the anisotropic etching also removes all portions of SiO$_2$ layers 220a, 220b not disposed beneath gate electrodes 252g, 254g, respectively, and spacers 266e-266f, 266g-266h, respectively, (i.e. the gate oxide layers of MOS transistors 252, 254). It is further noted that at this point photoresist layer 262 of FIG. 25 may be reapplied and patterned with windows 264a, 264b, 264c to re-expose, respectively: source and drain regions 252s, 252d of MOSFET 252; contact region 255 of MOSFET 254; and the portions of inactive base region 226' not masked by emitter region 230 and spacers 266a, 266b. Then, additional p-type dopant (such as boron) may be implanted therein to increase the dopant concentrations of source, drain and contact regions 252s, 252d, 255 and inactive base region 226'. It is noted that such photoresist layer 262 masks MOS transistor 254 from such added p-type dopant implant. It is also noted that such re-applied photoresist layer 262 should be patterned to also mask emitter region 230 to prevent the added p-type dopant from excessively compensating the n-type dopant therein. Photoresist layer 262 is then conventionally removed.

The structure is then heated, here at between 900° C. and 920° C. for 30 minutes, to anneal out the implantation damage in epitaxial layer 214 and activate the implanted dopants in: emitter region 230; base region 226; collector contact 232; MOS gate electrodes 252g, 254g; MOS source regions 252s, 254s; MOS drain regions 252d, 254d; and MOS substrate contact regions 253, 255. Here, p-type (i.e. boron) doped regions 252s, 252d, 255 reach a depth of between approximately 2500 Å and 3000 Å, while that of n-type (i.e. arsenic) doped regions 254s, 254d, 253, is between 1500 Å and 2000 Å.

As further shown in FIG. 27, a metal layer, here comprising titanium, is deposited over the surface of the structure and the structure heated to alloy such metal with exposed silicon surfaces. As discussed, the metal does not react with SiO$_2$ surfaces (such as surfaces of insulating spacers 266a-266h). The unreacted metal is then removed, here with hydrogen peroxide. As previously discussed and as shown in FIG. 27, self-aligned silicide contacts 268, 270, 272 remain on the surfaces of the inactive base region 226', polysilicon emitter region 230 and polysilicon collector contact 232, respectively, of bipolar transistor 256. Silicide contact 274 is disposed on the surface of epitaxial layer area 214c at the p-n junction between inactive base region 226' and collector region 214c, thereby providing a Schottky diode between the base and collector of bipolar transistor 256, as discussed. Additionally, silicide contacts 276, 278, 280 are disposed on the surfaces of source region 252s, gate electrode 252g and drain region 252d of p-channel MOSFET 252, as shown. Likewise, source region 254s, gate electrode 254g and drain region 254d of n-channel MOSFET 254 have silicide contacts 282, 284, 286, respectively, disposed thereon.

With this arrangement, the silicide contacts 268-286 are formed on as much of the surfaces of the transistors 252, 254, 256 as possible, with adjacent silicide contacts being electrically insulated from each other by insulating sidewall spacers 266a-266h. Because SiO$_2$ spacers 266a-266h are quite narrow (here between 1000 Å and 2500 Å), the silicide contacts 268-286 are self-aligned to cover as much surface area as possible, thereby reducing the contact resistance of the respective device regions covered by such silicide contacts 268-286. For example, base silicide contact 268 covers the entire surface of inactive base region 226' except that covered by spacer 266a, thereby reducing the lateral base resistance of bipolar transistor 256. Likewise, source and drain silicide contacts 276, 280 of MOSFET 252 and source and drain silicide contacts 282, 286 of MOSFET 254 each cover substantially the entire surface of their respective device regions (i.e., source and drain regions) and terminate within between 1000 Å and 2500 Å (the width of a sidewall spacer) of respective gate electrodes 252g, 254g, thereby substantially reducing the contact resistance, source-to-gate resistance and gate-to-drain resistance of MOSFET's 252, 254. Also, the length of such MOSFETs may be substantially reduced, as discussed above for bipolar transistor, here to about 5 μm each (approximately the same as the width of bipolar transistor 256, as discussed above in conjunction with FIG. 10). Finally, with the process of the present invention Bi-CMOS transistors may be fabricated together on the same substrate with a minimum of added masking steps.

Figure 28:
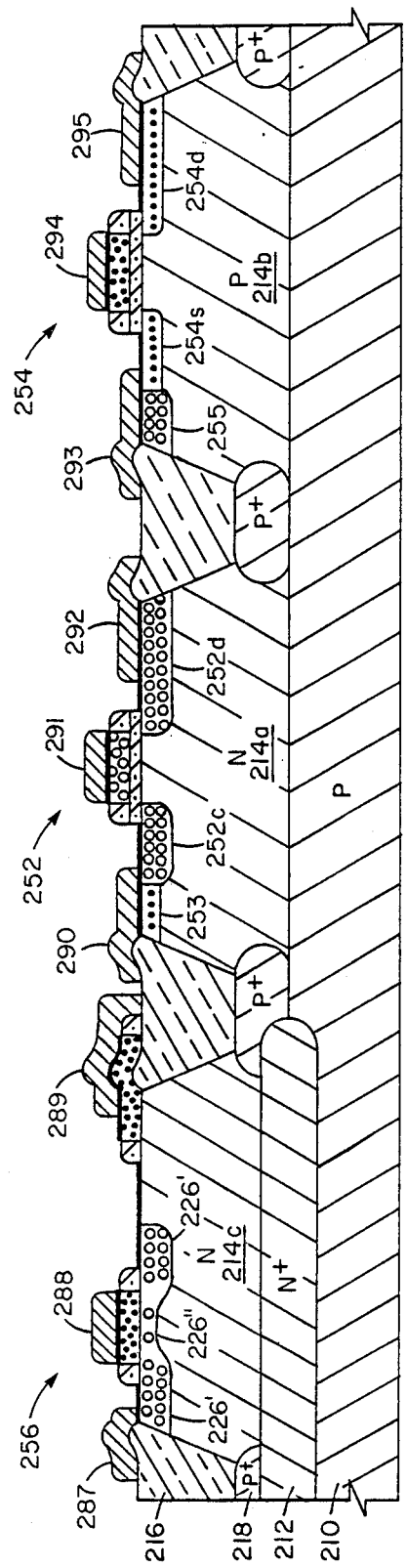

Referring to FIG. 28, metal contacts 287, 288, 289 are applied to the base, emitter and collector silicide contacts of bipolar transistor 256 in a conventional manner as discussed above. Also applied in the same manner are source, gate, and drain metal interconnects 290, 291, 292 for MOSFET 252 and 293, 294, 295 for MOSFET 254, as shown, to complete the fabrication of CMOS transistor pair 252, 254. Metal electrode 290 should cover the p-n junction between source region 252s and contact region 253, and metal electrode 293 should likewise overlay the p-n junction between source region 254s and contact region 255, so that such p-n junctions are further ensured to be short-circuited.

Having described preferred embodiments of the present invention, modifications and alterations thereto may become apparent to those skilled in the art. Accordingly, it is intended that the scope of the present invention be limited only by the scope of the appended claims.

What is claimed is:

1. A method of forming a bipolar transistor in a region of a semiconductor structure having an upper surface comprising the steps of:
   (a) forming:
      (i) a base region in the region of the semi-conductor structure, said base region having a first portion and a second portion disposed adjacent to the first portion;
      (ii) an emitter region on the upper surface of the semiconductor structure above the first portion of the base region, said emitter region having an upper surface and a side surface; and
      (iii) a collector region;
   (b) forming a layer of insulating material over the region of the semiconductor structure, said layer being disposed above the surface of the second portion of the base region and the upper surface of the emitter region and the collector region;

(c) selectively removing portions of said insulating material layer to expose the upper surface of the emitter region and a portion of the surface of the second portion of the base region, and to maintain a first region of the insulating material adjacent the side surface of the emitter region;

(d) disposing a layer of metal over the region of the semiconductor structure, said layer disposed above the exposed surfaces of the emitter region and exposed portion of the second portion of the base region and the maintained first region of the insulating layer; and (e) selectively removing the portions of the metal layer above the maintained first region of the insulating layer, while maintaining a continuous portion of said metal layer in contact with a portion of the base region and a portion of the collector region.

2. The method of claim 1 further comprising the step of forming a base electrode comprising metal on the portion of the metal layer above the exposed portion of the second portion of the base region and an emitter electrode comprising metal on the portion of the metal layer above the exposed upper surface of the emitter region.

3. The method of claim 1 wherein said step of selectively removing portions of the insulating layer comprises vertically anisotropically etching said insulating layer.

4. The method of claim 1 wherein:
(a) the step of forming an emitter region further comprises the step of disposing a collector contact over a surface of the semiconductor structure spaced from the base region and the second side surface of the emitter region, said collector contact having an upper surface and a side surface;
(b) the step of forming a layer of insulating material additionally comprises forming the layer over the collector contact region; and
(c) the step of selectively removing portions of said insulating layer further comprises removing portions of said layer to expose a portion of the surface of the semi-conductor structure between the emitter region and the collector contact region and the upper surface of the collector contact, and to maintain a second region of the insulating material adjacent the side surface of the collector contact region.

5. The method of claim 4 further comprising the step of disposing an electrode over the collector contact region.

6. The method of claim 4 wherein said step of selectively removing portions of said insulating layer comprises the step of vertically anisotropically etching said insulating layer.

7. A method of forming a bipolar transistor in a semiconductor structure having a first-type conductivity, comprising the steps of:
(a) forming a doped region having a second-type conductivity, opposing the first-type conductivity, in the semiconductor structure;
(b) disposing an emitter region comprising semiconductor material having the first-type conductivity on a surface of a first portion of the doped region, said emitter region having an upper surface and a first side surface;

(c) implanting particles having the second-type conductivity in portions of the semiconductor structure in a second portion of the doped region adjacent the first portion of the doped region and the first side surface of the emitter region;

(d) forming a layer of insulating material over:
(i) a surface of the second portion of the doped region;
(ii) the first side surface of the emitter region; and
(iii) the upper surface of the emitter region;

(e) selectively removing portions of said insulating material layer to expose the upper surface of the emitter region and a portion of the surface of the second portion of the doped region, and to maintain a first region of the insulating material between the exposed portion of the surface of the second portion of the doped region and the first side surface of the emitter region; and (f) implanting particles having the second-type conductivity in portions of the semi-conductor structure in the second portion of the doped region adjacent the first region of insulating material.

8. The method of claim 7 wherein:
(a) the step of disposing an emitter region further comprises disposing a collector contact region comprising semiconductor material having the first-type conductivity on a surface of the semiconductor structure spaced from the second side surface of the emitter region, said collector contact region having an upper surface and a side surface;
(b) the step of forming an insulating material layer further comprises forming said insulating material layer additionally over:
(i) the second side surface of the emitter region;
(ii) the surfaces of the semiconductor structure disposed between the emitter region and the collector contact region; and
(iii) the side surface and upper surface of the collector contact region; and
(c) said selective removal step further comprises removing portions of said insulating material to expose:
(i) a portion o the surface of the semiconductor structure disposed between the emitter region and the collector contact region, and
(ii) the upper surface of the collector contact contact region, and to maintain a second region of the insulating material between said exposed portion of the surface of the semiconductor structure disposed between the emitter region and the collector contact region and the side surface of the collector contact region.

9. The method of claim 8 further comprising the step of forming a contact comprising metal on the exposed surface portions of the semiconductor structure disposed between the emitter region and the collector region, with the first region of the insulating material electrically insulating said metal contact from the emitter region, and the second region of the insulating material electrically isolating said metal contact from the collector contact region.

10. The method of claim 8:
(a) wherein the step of disposing a collector contact region comprises disposing the collector contact region on the surface of the semiconductor structure spaced apart from the doped region; and
(b) the step of forming an inactive base region comimplanting particles while portions of the surface of the semiconductor structure between the doped region and the collector region is masked; and (c) the step of implanting particles comprises implanting particles while said portions of the surface of the semiconductor structure between the doped region and the collector contact region are masked; and (d) further comprising the step of preventing said metal contact from forming in a region of the junction between the doped region and said masked portion of the semiconductor structure.

11. The method of claim 7 wherein the inactive base forming step comprises implanting particles of the second-type conductivity into the portion of the doped region unmasked by the emitter region to form the inactive base region in said second portion of the doped region.

12. The method of claim 11 wherein the step of implanting particles comprises implanting particles of the second-type conductivity into the portion of the inactive base region unmasked by said emitter region and the first region of the insulating material.

13. The method of claim 12 further comprising the step of masking the emitter region during the implantation of particles of the second-type conductivity into the portion of the inactive base region unmasked by the emitter region and the first region of the insulating material.

14. The method of forming a bipolar transistor as in claim 1 herein the step of forming a base region and an emitter region comprises:

(a) implanting a first type conductivity dopant in the base region;

(b) depositing a layer of polysilicon having a second type conductivity dopant over the region of the semiconductor substrate;

(c) forming a photoresist layer over the polysilicon layer above the regions where the emitter regions are desired;

(d) directively etching the polysilicon layer until the color of the semiconductor substrate begins to change and stopping the etching when the color of the semiconductor substrate stops changing; and (e) implanting a first type conductivity dopant in the base region unmasked by the emitter region.

15. The method of forming a bipolar transistor as in claim 14 wherein the directive etching comprises reactive ion etching or plasma etching.

16. A method of forming a bipolar transistor in a region of a semiconductor structure having an upper surface comprising the steps of:

(a) forming:
 (i) a base region in the region of the semiconductor structure, said base region having a first portion and a second portion disposed adjacent to the first portion;
 (ii) an emitter region on the upper surface of the semiconductor structure above the first portion of the base region, said emitter region having an upper surface and a side surface; and
 (iii) a collector contact region on the upper surface of the semiconductor structure, said collector contact region having an upper surface and a side surface;

(b) forming a layer of insulating material over the region of the semiconductor structure, said layer being disposed above the surface of the second portion of the base region and the upper surface of the emitter region and the upper surface of the collector region;

(c) selectively removing portions of said insulating material layer to expose the upper surface of the emitter region, the upper surface of the collector region, and a portion of the surface of the second portion of the base region, while maintaining a first region of the insulating material on the exposed surface portion of the second portion adjacent the side surface of the emitter region and a second region of insulating material adjacent the side surface of the collector region;

(d) disposing a layer of metal over the region of the semiconductor structure, said layer being disposed above the exposed surfaces of the emitter region and the exposed portion of the second portion of the base region and the maintained portions of the insulating layer; and (e) selectively removing the portions of the metal layer above the maintained portions of the insulating layer, while maintaining a portion of said metal layer continuously between the first maintained region of the insulating material and the second maintained region of insulating material.

17. The method of forming a bipolar transistor as in claim 16 wherein the step of forming a layer of insulating material comprises forming a layer of silicon dioxide.

18. The method of forming a bipolar transistor as in claim 16 wherein the step of selectively removing portions of said insulating material comprises vertical etching the insulating layer for a time sufficient to expose the upper surface of the emitter region and to maintain the first region of insulating material.

19. The method of forming a bipolar transistor as in claim 16 wherein the step of removing the metal layer above the maintained portions of the insulating layer comprises:

(a) reacting the metal with exposed portions of the semiconductor substrate, base region and emitter region to form a silicide layer; and (b) removing the unreacted metal.

20. The method of forming a bipolar transistor as in claim 19 wherein the step of removing the unreacted metal comprises dissolving the metal in hydrogen peroxide.

21. The method of forming a bipolar transistor as in claim 20 wherein the step of disposing a layer of metal comprises disposing a layer of metal selected from the group consisting of titanium, platinum and palladium.

22. The method of forming a bipolar transistor as in claim 21 wherein the step of reacting the metal with exposed portions of the semiconductor substrate forms a Schottky junction between the metal layer and the exposed portions of the semiconductor substrate.

23. The method of forming a bipolar transistor as in claim 1 wherein the step of removing portions of the metal layer comprises the steps of:

(a) reacting the metal layer with exposed portions of the semiconductor structure to form silicide; and (b) removing the unreacted portions of the metal layer.

24. The method of forming a bipolar transistor as in claim 23 wherein the portion of the metal layer maintaining contiguously with a portion of the base region and a portion of the collector region forms a Schottky diode.

25. The method of forming a bipolar transistor as in claim 24 wherein the metal layer consists of a metal selected from the group of platinum and palladium.

26. In a bipolar junction transistor of the type wherein a base region is disposed in a first surface portion of a semiconductor substrate, a collector region is disposed in a second surface portion of the semiconductor substrate, the first surface portion being contiguous to the second surface portion of the semiconductor substrate along an junction between the base region and the collector region, and emitter region is disposed above a portion of the base region, such emitter region having a side surface laterally spaced from the junction, a method of forming a bipolar transistor comprising the steps of:

(a) disposing a layer of insulating material over the emitter region, over the side surface of the emitter region, and over the junction;
(b) selectively removing portions of the insulating layer over the emitter region and over the junction to expose the junction and the emitter region while maintaining a portion of the insulating layer over the side surface of the emitter region;
(c) disposing a layer of metal over the exposed portions of the emitter region and the junction and over the maintained portion of the insulating layer;
(d) selectively removing portions of the metal layer disposed over the maintained portion of the insulating layer while maintaining a portion of the metal layer over the emitter region, and over the junction, said maintained metal layer also being contiguous with the junction.

* * * * *